United States Patent
Weber et al.

(10) Patent No.: US 9,391,149 B2
(45) Date of Patent: Jul. 12, 2016

(54) SEMICONDUCTOR DEVICE WITH SELF-CHARGING FIELD ELECTRODES

(71) Applicant: Infineon Technologies Austria AG, Villach (AT)

(72) Inventors: Hans Weber, Bayerisch Gmain (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 88 days.

(21) Appl. No.: 13/921,935

(22) Filed: Jun. 19, 2013

(65) Prior Publication Data

US 2014/0374842 A1 Dec. 25, 2014

(51) Int. Cl.
*H01L 29/40* (2006.01)
*H01L 29/861* (2006.01)
*H01L 29/872* (2006.01)

(52) U.S. Cl.
CPC ............ *H01L 29/404* (2013.01); *H01L 29/861* (2013.01); *H01L 29/872* (2013.01)

(58) Field of Classification Search
CPC ............................. H01L 29/404; H01L 29/872
USPC .......................................................... 257/409
See application file for complete search history.

(56) References Cited

U.S. PATENT DOCUMENTS

| | | | |
|---|---|---|---|
| 7,173,306 B2 | 2/2007 | Hirler et al. | |
| 2002/0121678 A1 | 9/2002 | Huang | |
| 2004/0031987 A1 | 2/2004 | Henninger et al. | |
| 2005/0082591 A1* | 4/2005 | Hirler et al. | 257/302 |
| 2006/0121678 A1 | 6/2006 | Brask et al. | |
| 2007/0013830 A1 | 1/2007 | Hayawaka | |
| 2007/0023830 A1 | 2/2007 | Pfirsch et al. | |
| 2007/0114600 A1 | 5/2007 | Hirler et al. | |
| 2007/0296039 A1 | 12/2007 | Chidambarrao et al. | |
| 2008/0258208 A1 | 10/2008 | Hirler et al. | |
| 2012/0286355 A1* | 11/2012 | Mauder et al. | 257/330 |
| 2013/0082322 A1* | 4/2013 | Weber et al. | 257/329 |

OTHER PUBLICATIONS

Hans Weber. "Semiconductor Device with Self-Charging Field Electrodes and Compensation Regions." U.S. Appl. No. 13/331,843, filed Dec. 20, 2011.

* cited by examiner

*Primary Examiner* — Jerome Jackson, Jr.
*Assistant Examiner* — Damian A Hillman
(74) *Attorney, Agent, or Firm* — Murphy, Bilak & Homiller, PLLC

(57) ABSTRACT

A semiconductor device includes a drift region of a first doping type, a junction between the drift region and a device region, and a field electrode structure in the drift region. The field electrode structure includes a field electrode, a field electrode dielectric adjoining the field electrode, arranged between the field electrode and the drift region, and having an opening, and at least one of a field stop region and a generation region. The semiconductor device further includes a coupling region of a second doping type complementary to the first doping type. The coupling region is electrically coupled to the device region and coupled to the field electrode.

29 Claims, 15 Drawing Sheets

SEMICONDUCTOR DEVICE WITH SELF-CHARGING FIELD ELECTRODES

TECHNICAL FIELD

Embodiments of the present invention relate to a semiconductor device, in particular a power semiconductor device.

BACKGROUND

Power semiconductor devices, such as power MOS transistors or power diodes, include a drift region and a pn junction between the drift region and a body region in an MOS transistor and between the drift region and an emitter region in a diode. The doping concentration of the drift region is lower than the doping concentration of the body and emitter region, so that a depletion region (space charge region) mainly expands in the drift region when the device blocks, which is when the pn junction is reverse biased.

The dimension of the drift region in a current flow direction of the device and the doping concentration of the drift region mainly define the voltage blocking capability of the semiconductor device. In a unipolar device, such as a power MOSFET, the doping concentration of the drift region also defines the on-resistance of the device, which is the electrical resistance of the semiconductor device in the on-state.

When the pn junction is reverse biased dopant atoms are ionized on both sides of the pn junction resulting in a space charge region that is associated with an electrical field. The integral of the magnitude of the field strength of the electrical field corresponds to the voltage that reverse biases the pn junction, where the maximum of the electrical field is at the pn junction. An Avalanche breakthrough occurs when the maximum of the electrical field reaches a critical field strength that is dependent on the type of semiconductor material used to implement the drift region.

The doping concentration of the drift region may be increased without reducing the voltage blocking capability of the device when charges are provided in the drift region that may act as counter charges to ionized dopant atoms in the drift region when the pn junction is reverse biased, which is when a depletion region expands in the drift region.

According to a known concept, field electrodes or field plates are provided in the drift region and are dielectrically insulated from the drift region by a field electrode dielectric. These field electrodes may provide the required counter charges.

According to one known concept, these field electrodes are electrically connected to a fixed electrical potential, such as gate or source potential in a MOSFET. However, this may result in a high voltage between the field electrode and those regions of the drift region close to the drain region in a MOSFET, so that a thick field electrode dielectric would be required. A thick field electrode dielectric, however, is space consuming.

According to a further known concept, several field electrodes are arranged distant to each other in a current flow direction of the drift region and these field electrodes are connected to different voltage sources, so as to bias these field electrodes to different potentials. Implementing the voltage sources, however, is difficult.

According to yet another known concept, the field electrodes are electrically connected to a doped semiconductor region of the same doping type as the drift region through a contact electrode arranged above a semiconductor body. This "coupling region" is at least partially shielded against the drift region by a semiconductor region of a complementary doping type.

According to still another known concept, the drift region includes compensation regions doped complementarily to the drift region and electrically coupled to the body region.

There is a need to reduce the on-resistance and to increase the voltage blocking capability of a semiconductor device with a drift region.

SUMMARY

One embodiment relates to a semiconductor device. The semiconductor device includes a drift region of a first doping type, a junction between the drift region and a device region, a field electrode structure in the drift region, and a coupling region of a second doping type complementary to the first doping type. The field electrode structure includes a field electrode, a field electrode dielectric adjoining the field electrode, arranged between the field electrode and the drift region, and having an opening, and at least one of a field stop region and a generation region. The coupling region is electrically coupled to the device region and coupled to the field electrode.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 16 which includes

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the FIGS. being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
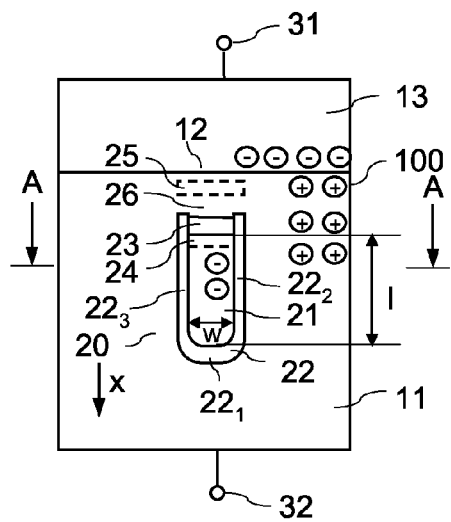
FIG. 1 illustrates a cross sectional view of a semiconductor device including a field electrode structure according to a first embodiment.

FIG. 1 illustrates a cross sectional view of a semiconductor device according to a first embodiment. The semiconductor device includes a semiconductor body 100, a drift region 11 of a first doping type and a junction 12 between the drift region 11 and a further device region 13. The junction 12 is either a pn junction or a Schottky junction. In the first case, the further device region 13 is a semiconductor region of a second doping type complementary to the first doping type. In the second case, the further device region 13 is a Schottky region or Schottky metal, such as, for example, aluminum (Al), tungsten silicide (WSi), tantalum silicide (TaSi), titanium silicide (TiSi), platinum silicide (PtSi), or cobalt silicide (CoSi).

The further device region 13 is electrically coupled to a first electrode or terminal 31, and the drift region 11 is electrically coupled or connected to a second electrode or terminal 32. These first and second electrodes are only schematically illustrated in FIG. 1.

The semiconductor device further includes at least one field electrode structure 20 in the drift region 11. The semiconductor device may include further device features, such as, for example, a gate electrode when the semiconductor device is implemented as an MOS transistor. However, in FIG. 1, as well as in FIGS. 2 to 9, only those features of the semiconductor device are illustrated that are necessary to understand the operating principle of the field electrode structure 20 arranged in the drift region 11. This field electrode structure 20 can be employed in any semiconductor device that includes a drift region, such as drift region 11 illustrated in FIG. 1, and a junction, such as junction 12 between the drift region 11 and the further device region illustrated in FIG. 1. Semiconductor devices having a drift region and a junction between an drift region and a further device regions are, but are not limited to, MOS transistors, such as MOSFETs (Metal Oxide Gate Field-Effect Transistors) or IGBTs (Insulated Gate Bipolar Transistors), p-i-n diodes, Schottky diodes, JFETs (Junction Field-Effect Transistors). The field electrode structures 20 as explained with reference to FIGS. 1 to 9 may be employed in vertical devices, in which a current flow direction of the device corresponds to a vertical direction of a semiconductor body of the device, or in lateral devices in which a current flow direction of the device corresponds to a lateral (horizontal) direction of a semiconductor body of the device.

Referring to FIG. 1, the field electrode structure 20 includes a field electrode 21 and a field electrode dielectric 22. The field electrode dielectric 22 adjoins the field electrode 21, is arranged between the field electrode 21 and the drift region 11 and has an opening 26, so that the field electrode dielectric 22 does not completely surround the field electrode 21 within the drift region 11. The field electrode structure 20 further includes a field stop region 23 of the first doping type and more highly doped than the drift region 11. The field stop region 23 couples or connects the field electrode 21 to the drift region 11 through the opening 26 of the field electrode dielectric 22. The doping concentration of the drift region 11 is, for example, in the range of between $10^{14}$ cm$^{-3}$ (1 e 14 cm$^{-3}$) and $10^{18}$ cm$^{-3}$ (1 e 18 cm$^{-3}$). The doping concentration of the field stop region is, for example, in the range of between $10^{16}$ cm$^{-3}$ (1 e 16 cm$^{-3}$) and $10^{20}$ cm$^{-3}$ (1 e 20 cm$^{-3}$). The doping of the field stop region 23 is such that the field stop region cannot be completed depleted of charge carriers when the depletion region expanding in the drift region 11 reaches the field stop region. When the semiconductor body 100 includes silicon as a semiconductor material, the field stop region 23 cannot be completely depleted of charge carriers when a dopant dose in the field stop region is higher than about $2 \cdot 10^{12}$ cm$^{-2}$ (2 e 12 cm$^{-2}$). The dopant dose of the field stop region 23 corresponds to the integral of the doping concentration of the field stop region 23 in the current flow direction x.

The field electrode dielectric 22 includes, for example, an oxide, a nitride, a high-k dielectric, a low-k dielectric, or the like. The field electrode dielectric 22 may even include a gas or a vacuum formed in a void surrounding the field electrode 21. According to one embodiment, the field electrode dielectric 22 is a composite layer with two or more different dielectric layers.

The semiconductor device has a current flow direction x, which is a direction in which charge carriers flow in the drift region 11 when the semiconductor device is conducting (is in an on-state). The field electrode 21 has a length l, which is a dimension of the field electrode 21 in the current flow direction x and has a width w, which is a dimension of the field electrode 21 in a direction perpendicular to the current flow direction x. One field electrode 21 may have a varying length and a varying width. In this case, the length "l" denotes the maximum of the length of the field electrode 21 and the width "w" defines the maximum of the width of the field electrode 21. The field electrode dielectric 22 basically has a U-shape with a bottom section $22_1$ and two leg sections $22_2$, $22_3$. The width w of the field electrode 21 is the dimension of the field electrode 21 between the two leg sections $22_2$, $22_3$ of the field electrode dielectric 22. As will be explained with reference to FIGS. 16A to 16D the U-shape of the field electrode dielectric 22 can be modified in many different ways. However, the modified U-shape also includes a bottom section $22_1$ and two leg sections defining the width w and between which the field electrode 21 is arranged.

An aspect ratio of the field electrode 21, which is the ratio between the length l and the width w is higher than 1, i.e. l/w>1. According to one embodiment, the aspect ratio l/w is between 1 and 50, in particular between 5 and 50. The thickness of the field electrode dielectric 22, which is dimension of the field electrode dielectric 22 between the field electrode 21 and the drift region 11, may vary. According to one embodiment, this thickness is between 10 nm and 2 μm.

The field electrode 21 has two longitudinal ends, which are those ends of the field electrode 21 in the direction of the current flow direction x. A first longitudinal end of the field electrode 21 faces the bottom section $22_1$ of the field electrode dielectric 22. The second longitudinal end of the field electrode 21 faces the opening 26 of the field electrode dielectric 22, where this opening 26 in the embodiment illustrated in FIG. 1 faces or is located in the direction of the junction 12 of the semiconductor device.

Before disclosing further details on possible implementations of the field electrode 21 and the field stop region 23 the basic operating principle of the semiconductor device, in particular of the field electrode structure 20, is explained with reference to FIG. 1. For explanation purposes it is assumed that the drift region 11 is n-doped, so that the junction 12 is reverse biased when a positive voltage is applied between the drift region 11 and the further device region 13 or between the second and first terminals 32, 31, respectively. However, the operating principle explained below also applies to semiconductor device with a p-doped drift correspondingly.

When the junction 12 is reverse-biased a depletion region (space charge region) expands in the drift region 11 beginning at the junction 12. The width of the depletion region, which is a dimension of the depletion region in a direction perpendicular to junction 12, is dependent on the voltage that reverse biases the junction 12. The width of the depletion region increases when the reverse biasing voltage increases. Within the depletion region there are ionized dopant atoms in the drift region 11. These ionized dopant atoms have a positive charge when the drift region 11 is n-doped (and have a negative charge when the drift region is p-doped). Negative charges corresponding to the positive charges in the drift region 11 are located in the further device region 13 on the other side of the junction 12. When the depletion region reaches the field stop region 23, an ionization process also sets in the field stop region 23 that has the same doping type as the drift region 11. In an n-doped field-stop region 23 electrons are generated thereby leaving positive dopant ions in the field stop region 23 (these ionized dopant atoms are not illustrated in FIG. 1). By virtue of the electric field caused by the positively charged ionized dopant atoms in the field stop region 23 and the drift region 11 the electrons generated in the field stop region 23 are driven away from the junction 12 in the current flow direction x of the semiconductor device. The field stop region 23 is adjacent the field electrode 21 in the current flow direction so that the electrons generated in the field stop region 23 are driven into the field electrode 21. By virtue of the field electrode dielectric 22 the electrons are "trapped" in the field electrode 21, so that the field electrode 21 is negatively charged. Through this, not only the further device region 13 but also the field electrode 21 provides negative charges (counter charges) corresponding to positive charges in the drift region 11.

The voltage blocking capability of the semiconductor device is reached when the electrical field generated by ionized dopant atoms in the drift region 11 and corresponding counter charges in the further device region 13 reaches the critical electrical field. The critical electrical field is a material constant of the semiconductor material of the semiconductor body, such as silicon. The reverse biasing voltage at which the critical electrical field is reached at the junction 12 is dependent on the doping concentration of the drift region 11 and is, therefore, dependent on the number of dopant atoms that can be ionized when a reverse biasing voltage is applied to the junction 12. When, however, like in the semiconductor device of FIG. 1, ionized dopant atoms in the drift region 11 find corresponding counter charges not only in the further device region 13 on the other side of the junction 12 but also within the drift region 11, namely in the field electrode 21, the doping concentration of the drift region 11 can be increased without decreasing the voltage blocking capability of the semiconductor device. Increasing the doping concentration of the drift region 11 is beneficial concerning the on-resistance of the semiconductor device. In a unipolar semiconductor device, such as, for example a MOSFET or a Schottky diode, the on-resistance is mainly defined by the ohmic resistance of the drift region 11, where the ohmic resistance of the drift region 11 decreases when the doping concentration of the drift region 11 increases.

The field electrode 21 is adjacent the field stop region 23 in the current flow direction so that charge carriers flow from the field stop region 23 into the field electrode 21 where they are trapped. The process of generating charge carriers that are trapped in the field electrode 21 is reversible, which means electrons trapped in the field electrode 21 flow back into the field stop region 23 when the depletion region in the drift region 11 is removed by switching off the reverse biasing voltage.

The charge carriers that flow into the field electrode 21 when the depletion region reaches the field stop region 23 are n-type charge carriers (electrons) when the drift region 11 and the field stop region 23 are n-doped regions. In this case, the field electrode 21 is negatively charged. When, however, the drift region 11 and the field stop region 23 are p-doped regions, p-type charge carriers flow into the field electrode 21, thereby positively charging the field electrode. When, for example, the field electrode 21 includes a metal, the flowing of p-type charge carriers into the field electrons corresponds to the flowing of electrons from the metal field electrode 21 into the field stop region 23.

Referring to FIG. 1, the field stop region 23 can be arranged completely within the field electrode dielectric 23, so that the field stop region 23 does not extend beyond the opening 26 of the field electrode dielectric 22 in the current flow direction x of the semiconductor device. The field electrode 21 includes, for example, a monocrystalline semiconductor material of the first doping type, a polycrystalline or amorphous semiconductor material, or a metal. An electrically conductive contact or contact region 24 may be arranged between the field stop region 23 and the field electrode 21 that electrically connects the field stop region 23 to the field electrode 21. When the field electrode 21 is a monocrystalline semiconductor region of the first doping type, the doping concentration of the field electrode 21 may correspond to the doping concentration of the field stop region 23. In this case both functions (field stop and field electrode) may be provided within the same semiconductor region. However, it is also possible for the field stop region 23 and the field electrode 21 to have different doping concentrations. According to one embodiment, the doping concentration of the field electrode 21 corresponds to the doping concentration of the drift region 11.

Optionally, the field electrode structure 20 includes a shielding structure 25 that is arranged distant to the opening 26 of the field electrode dielectric 22 in the current flow direction x. The shielding structure is in line with the field electrode structure 20. A width of the shielding structure, which is a dimension of the shielding structure in a direction perpendicular to the current flow direction may correspond to a width of the field electrode structure 20 or may be larger than the width of the field electrode structure.

According to one embodiment, the shielding structure 25 only includes a dielectric, such as, for example, an oxide. According to a further embodiment, the shielding structure 25 includes an electrode dielectrically insulated from the semiconductor regions, such as the drift region 11, by a dielectric. The electrode is, for example, electrically connected to a reference potential. This reference potential may be the electrical potential of the first terminal. In a MOSFET, that will be explained with reference to FIGS. 17 to 20 below, the reference potential could also be the electrical potential of the gate electrode. An electrode of the shielding structure 25 connected to a reference potential may provide counter charges to the charges in the field stop region 23 when the device is in a blocking state. According to a further embodiment, the shielding structure 25 is a semiconductor region of a doping type complementary to the doping type of the drift region 11.

Figure 2:
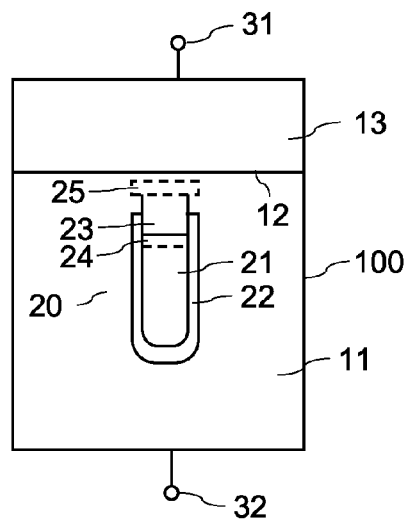
FIG. 2 illustrates a cross sectional view of a semiconductor device including a field electrode structure according to a second embodiment.

FIG. 2 illustrates a modification of the semiconductor device illustrated in FIG. 1. In the semiconductor device according to FIG. 2, the field stop region 23 extends through the opening 26 of the field electrode dielectric 22, so that the field stop region 23 extends beyond the opening 26 of the field electrode dielectric 22 in the current flow direction x. In the direction perpendicular to the current flow direction x the field stop region 23 does not extend beyond the field electrode dielectric 22 in the embodiment illustrated in FIG. 2.

Figure 3:
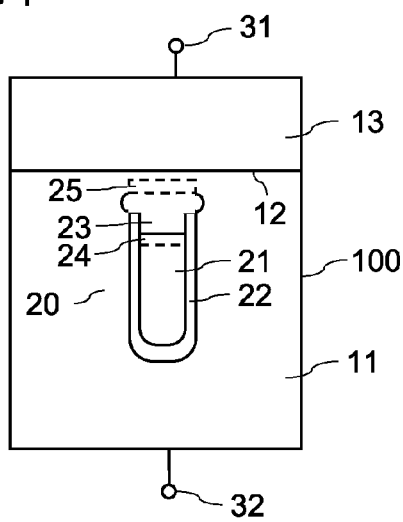
FIG. 3 illustrates a cross sectional view of a semiconductor device including a field electrode structure according to a third embodiment.

Referring to FIG. 3, the field stop region 23 may also extend beyond the field electrode dielectric 22 in the direction perpendicular to the current flow direction x. However, in this direction the field stop region 23 does not extend beyond the field electrode dielectric 22 more than 200 nm, more than 100 nm, or even not more than 50 nm.

In the embodiments illustrated in FIGS. 1 to 3 the field stop region 23 and the field electrode dielectric 22 completely separate the field electrode 21 and the drift region 11. However, this is only an example.

Figure 4:
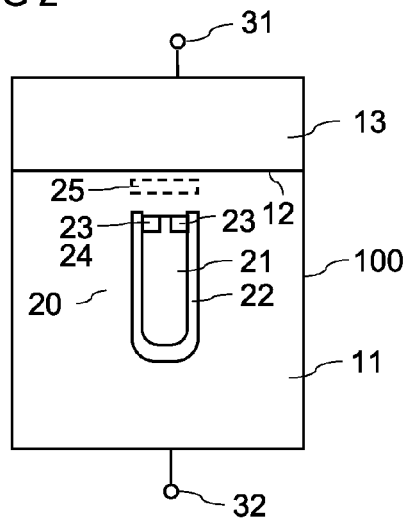
FIG. 4 illustrates a cross sectional view of a semiconductor device including a field electrode structure according to a fourth embodiment.

According to a further embodiment illustrated in FIG. 4, a section of the field electrode 21 adjoins the drift region 11 next to the field stop region 23. In the embodiment illustrated in FIG. 4, the field stop region 23 has two field stop region sections between which the field electrode 21 extends to the drift region 11. However, this is only an example. According to a further embodiment (not illustrated) the field stop region 23 includes only one section. In the embodiment illustrated in FIG. 4, the field stop region 23 is completely arranged within the field electrode dielectric 22. However, the field stop region 23 could also extend beyond the opening of the field electrode dielectric 22 in the current flow direction.

Figure 5:
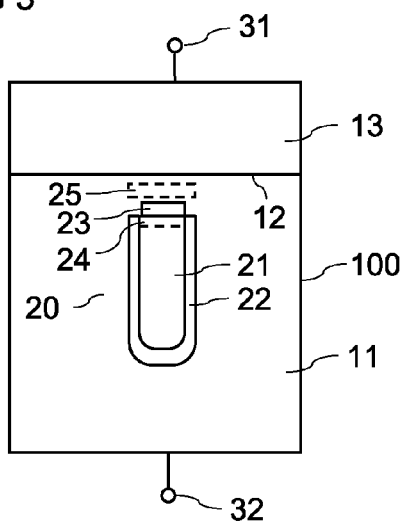
FIG. 5 illustrates a cross sectional view of a semiconductor device including a field electrode structure according to a fifth embodiment.

FIG. 5 illustrates a further embodiment of the semiconductor device. In this embodiment, the field stop region 23 is only arranged outside the field electrode dielectric 22. In this embodiment, the field electrode 21 or the optional contact 24 extends to the opening of the field electrode dielectric 22 and adjoins the field stop region 23. In the embodiment illustrated in FIG. 5, the field stop region 23 and the field electrode dielectric 22 completely separate the field electrode 21 and the drift region 11. However, this is only an example. There could also be sections of the field electrode 21 that adjoin the drift region 11, as illustrated in FIG. 4.

Although the size of the opening 26 corresponds to the width w of the field electrode 21 in the embodiments illustrated in FIGS. 1 to 5, this is only an example.

Figure 6:
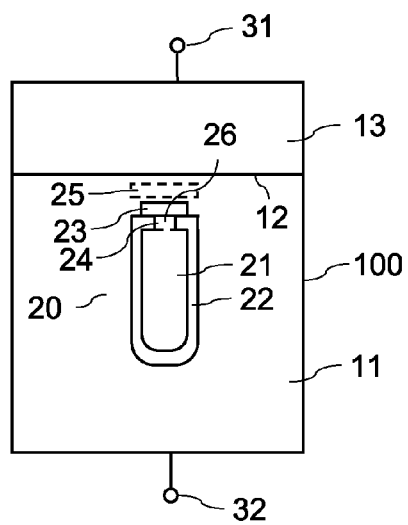
FIG. 6 illustrates a cross sectional view of a semiconductor device including a field electrode structure according to a sixth embodiment.

Referring to FIG. 6, the field electrode dielectric 22 can be implemented with an opening 26 that is smaller than the width w of the field electrode 21. This small opening of the field electrode dielectric 22 can be employed with each of the embodiments explained with reference to FIGS. 1 to 5. Having the field stop region 23 arranged outside the field electrode dielectric 22 and adjoining the field electrode 21 or the contact 24 in the opening 26 as illustrated in FIG. 6, is only one of many different embodiments of implementing the field stop region 23 in connection with a smaller opening.

Figure 7:
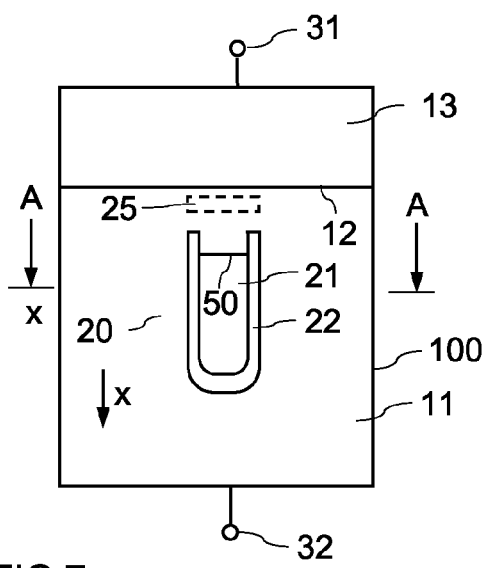
FIG. 7 illustrates a cross sectional view of a semiconductor device including a field electrode structure according to a seventh embodiment.

FIG. 7 illustrates a further embodiment of a semiconductor device with a field electrode structure 20. This field electrode structure 20 includes a generation region 50 that is configured to generate charge carrier pairs, namely holes and electrons, when the depletion region reaches the generation region 50 when the junction 12 is reverse biased. Unlike the field stop region 23 explained with reference to FIGS. 1 to 6 that generates a first type of charge carriers, namely electrons in the example explained before, flowing into the field electrode 21 and fixed charge carriers of a second type, namely positive ionized dopant atoms, the generation region 50 generates two types of charge carriers that can move within the drift region. For explanation purposes it is again assumed that the drift region 11 is an n-type drift region so that there are positive dopant ions (ionized dopant atoms) in the drift region 11 when the junction 12 is reverse biased. When the depletion region reaches the generation region 50 electrons and holes are generated, whereas electrons by virtue of the electric field are driven away from the junction 12 and into the field electrode 21 within the field electrode dielectric 22. The effect of trapping the electrons in the field electrode 21 is the same as explained with reference to FIG. 1. The holes are driven in the direction of the junction 12 and reach the first electrode 31 (that is only schematically illustrated and that may include a metal), where they recombine with electrons, or some of the holes accumulate at the optional shielding structure 25 that prevents the holes from flowing to the junction 12.

The at least one generation region 50 can be implemented in many different ways. According to one embodiment, the generation region 50 is an interface region between the field electrode 21 and the drift region 11. In this case, the field electrode 21 includes, for example, a metal, a silicide, or carbon. According to a further embodiment, the field electrode includes a polycrystalline semiconductor material, an amorphous semiconductor material or a monocrystalline semiconductor material into which foreign material atoms are implanted or diffused or that includes crystal defects. Suitable foreign material atoms are, for example, heavy metal atoms, such as, for example, gold atoms, or platinum atoms. Crystal defects can be generated by implanting particles, such as argon (Ar) or germanium (Ge) atoms, semiconductor atoms, or the like, into the field electrode. When the field electrode 21 includes a polycrystalline or an amorphous semiconductor material or a monocrystalline semiconductor material with foreign material atoms or crystal defects, there is a plurality of generation regions 50 within the field electrode 21. Each of the foreign material atoms or each of the crystal defects in a monocrystalline material or the inherent crystal borders in a monocrystalline or an amorphous material may act as a generation region. According to a further embodiment, the field electrode 21 includes a monocrystalline semiconductor material that is doped complementarily to the drift region 11.

The position of the generation region 50 relative to the field electrode 21 may correspond to the position of the field stop region 23 relative to the field electrode 21 explained before. Like the field stop region 23 explained with reference to FIGS. 1 to 6, the generation region 50 can be adjacent the field electrode 21 in the current flow direction x of the semiconductor device, so that charge carriers, such as electrons, that are generated in the generation region 50 flow into the field electrode 21 where they are trapped. However, it is also possible to provide at least one generation region 50 within the field electrode, for example, when the field electrode 21 includes a polycrystalline or an amorphous semiconductor material or a monocrystalline semiconductor material with crystal defects. Like the effect that has been explained with reference to the field stop region 23 charging the field electrode 21 is reversible. When the voltage that reverse biases the junction is reduced or switched off, charge carriers trapped in the field electrode 21 are removed from the field electrode 21, so as to discharge the field electrode 21. These charge carriers may either recombine at the generation region 50 with complementary charge carriers or may flow to one of the electrodes via the drift region. When, for example, the drift region 11 is n-doped, so that electrons are trapped in the field electrode 21 when the junction 12 is reverse biased, these electrons recombine with holes at the generation region 50 or flow to the second electrode 32 when the reverse biasing voltage is switched off or is reduced. The number of electrons that recombine with holes is dependent on the number of holes that are kept in the drift region 11 when the junction is reverse-biased. When the junction is reverse biased, holes are, for example, kept at the shielding structure 25 that may act as a trap for charge carriers that are complementary to charge carriers that charge the field electrode 21.

The field electrode structure 20 may include a field stop region 23 and a generation region 50, which means, the field stop region 23 and the generation region 50 can be combined in one field electrode structure. When, for example, in the embodiment illustrated in FIG. 4, the field electrode 21 includes a metal, a polycrystalline or amorphous semiconductor material, or a monocrystalline semiconductor material with foreign material atoms or crystal defects there is a generation region at or close to the interface between the field electrode 21 and the drift region 11, or in the field electrode 21. According to a further embodiment (not illustrated), the semiconductor device includes a field stop region 23 of the same doping type as the drift region 11 as explained before and a semiconductor region of a complementary doping type. The field stop region and the complementary semiconductor region are connected by a metallic electrode, and the complementary region may be arranged between the field stop region and the field electrode 21. In this embodiment, the field stop region, the metallic electrode and the complementary region form a generation region, so that both a field stop region and a generation region are available in this device.

Figure 8:
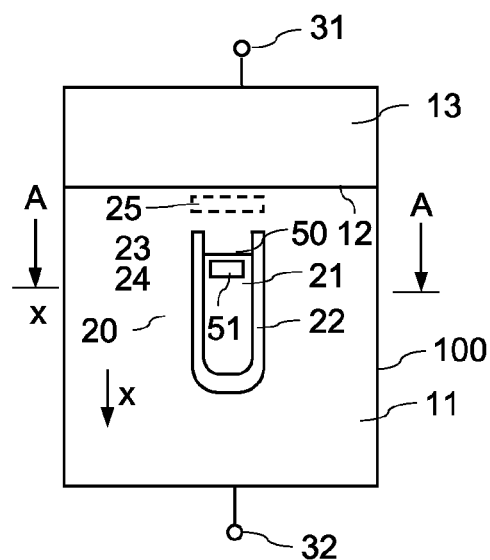
FIG. 8 illustrates a cross sectional view of a semiconductor device including a field electrode structure according to an eighth embodiment.

FIG. 8 illustrates a further embodiment of a semiconductor device including a field electrode structure 20 with a generation region 50. In this embodiment, the field electrode 21 includes a metal or silicide region 51. This metal or silicide region 51 or an interface between the metal or silicide region 51 and the field electrode 21 acts as a generation region. Dependent on the implementation of the field electrode 21, the generation region formed by the metal or silicide region 51 may be the only generation region in the device or may be one of several generation regions. According to one embodiment, the field electrode 21 includes a monocrystalline semiconductor material. In this case, a generation region is only formed at the interface between the metal or silicide region 51 and the field electrode. According to a further embodiment, the field electrode includes a polycrystalline or an amorphous semiconductor material, or a monocrystalline semiconductor material with foreign material atoms or crystal defects. In this case, there are additional generation regions in the field electrode.

Figure 9:
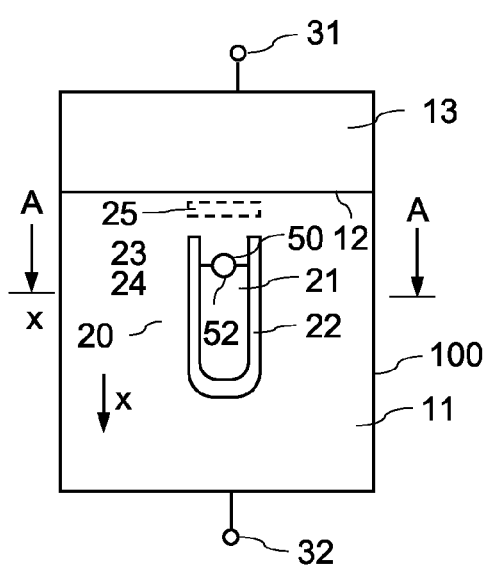
FIG. 9 illustrates a cross sectional view of a semiconductor device including a field electrode structure according to a ninth embodiment.

Referring to FIG. 9, the generation region 50 may include a void 52 adjoining the drift region 11. The interface between the drift region 11 and the void 52 acts as generation region 50. In the embodiment illustrated in FIG. 9, the void 52 also extends into the field electrode 21. However, this is only an example. The void 52 could also be distant to the field electrode 51. Like the field stop region 23 explained with reference to FIGS. 1 to 6, the generation region 50 is arranged adjacent or neighboring the field electrode 21 in the current flow direction x of the semiconductor device. The generation region 50 can be arranged within the field electrode dielectric 22 or could also be arranged outside the field electrode dielectric 22 but in line with the field electrode 21 in the current flow direction x so that charge carriers generated in the generation region 50 are driven through the opening 26 into the field electrode 21.

Figure 10:
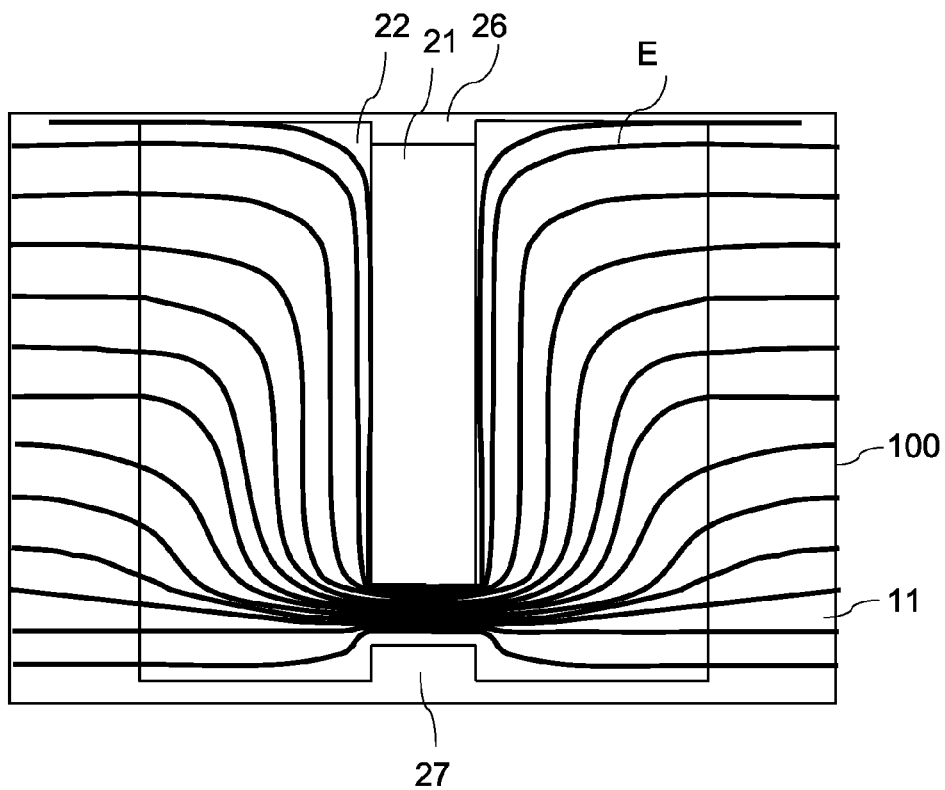
FIG. 10 illustrates equipotential lines in semiconductor device in the region of the field electrode structure when the semiconductor device is blocking.

FIG. 10 schematically illustrates equipotential lines of an electric potential in the region of the field electrode 21 and the field electrode dielectric 22 in a semiconductor device when the junction (not illustrated in FIG. 10) is reverse biased. The figure applies to semiconductor devices that include either a field stop region, such as the field stop region 23 explained with reference to FIGS. 1 to 6, or a generation region, such as the generation region 50 explained with reference to FIGS. 7 to 9. As can be seen from FIG. 10, there is no electric field within the field electrode 21. The electric potential of the field electrode 21 corresponds to the electrical potential, the drift region 11 has at a position at which the field stop region 23 or the generation region 50 is located. In FIG. 10, the field electrode dielectric 22 below the field electrode 21 is drawn to be thicker than the field electrode dielectric 22 along sidewalls of the field electrode 21. However, the field electrode dielectric 22 below the field electrode 21 could be as thick as the field electrode dielectric 22 along sidewalls of the field electrode 21.

Figure 11:
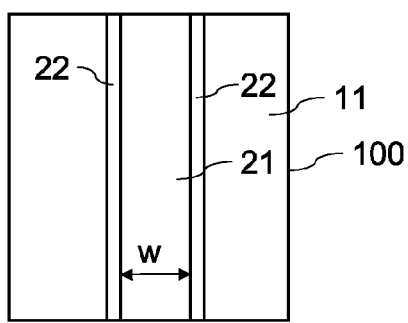
FIG. 11 illustrates a stripe-shaped field electrode structure.

FIG. 11 illustrates a cross sectional view of the semiconductor body 100 in a section plane A-A that is illustrated in FIG. 1. This section plane A-A cuts through the field electrode 21 and the field electrode dielectric 22 and is perpendicular to the section plane illustrated in FIGS. 1 to 9. In the embodiment illustrated in FIG. 11, the field electrode 21 has a stripe-shape and extends longitudinally in a direction perpendicular to a direction in which the width w of the field electrode 21 is defined.

Figure 12:
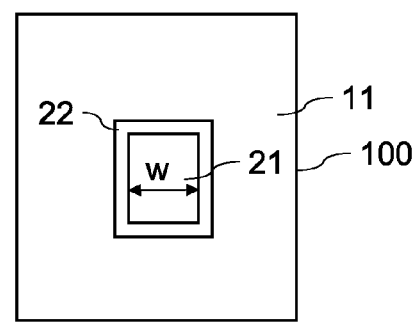
FIG. 12 illustrates a pile-shaped field electrode structure.

FIG. 12 illustrates a further embodiment in which the field electrode 21 has a pile-shape. In the embodiment illustrated in FIG. 12, the field electrode 21 has a rectangular cross section. However, this is only an example. The pile-shaped field electrode 21 could also have any other cross sections, such as, for example an elliptical cross section, a hexagonal cross section, or any other polygonal cross section.

Figure 13:
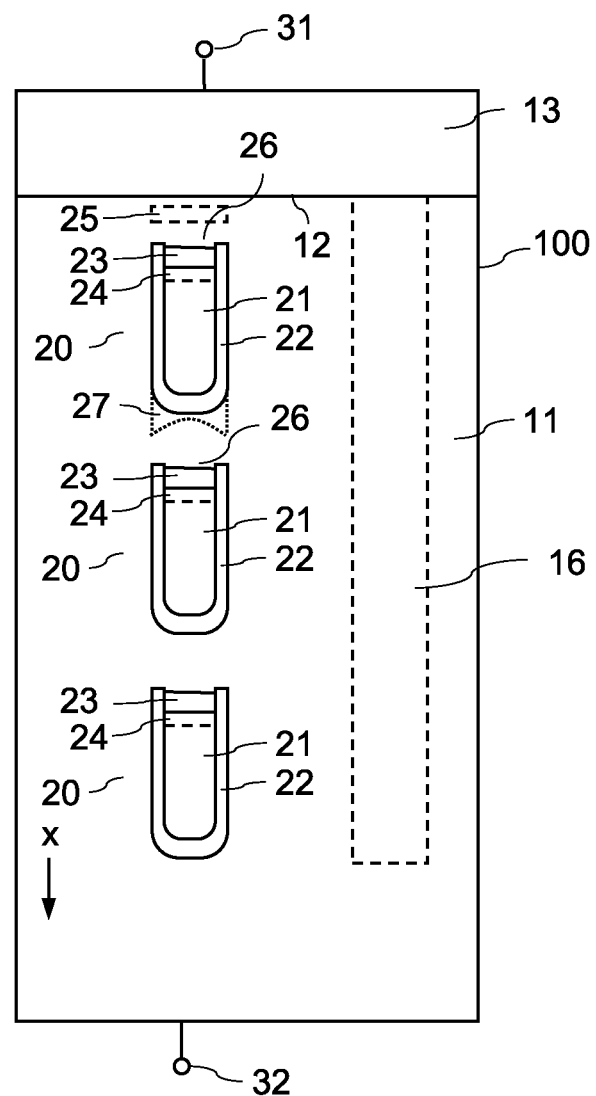
FIG. 13 illustrates a cross sectional view of a semiconductor device according to a first embodiment that includes a plurality of field electrode structures arranged in line with each other in a current flow directional of the semiconductor device.

FIG. 13 illustrates a cross sectional view of an embodiment of a semiconductor device that includes a plurality of field electrode structures 20 that are distant to each other in the current flow direction x of the semiconductor device. The semiconductor device according to FIG. 13 includes three field electrode structures 20. However, this is only an example. The number of field electrode structures 20 can be selected arbitrarily, in particular dependent on the desired voltage blocking capability of the semiconductor device and dependent on the length of the drift region 11. The length of the drift region 11 is the dimension of the drift region 11 in the current flow direction. When in the device according to FIG. 13, the junction 12 is reverse biased so that a depletion region expands in the drift region 11, the depletion region first reaches the field electrode structure 20 arranged closest to the junction 12 so that the field electrode 21 of this field electrode structure is biased in order to provide counter charges to ionized dopant atoms in the drift region 11. When the depletion region propagates further in the drift region 11, and reaches a next field electrode structure 20, the field electrode 21 of this field electrode structure is also biased. This process proceeds, when the voltage reverse biasing the junction 12 increases, until the field electrode 21 of the field electrode structure most distant to the junction 12 is biased.

The field electrode structures 20 illustrated in FIG. 13 correspond to the field electrode structure 20 explained with reference to FIG. 1. However, this is only an example. Any other field electrode structure 20 with a field stop region 23 and/or a generation region 50 explained hereinbefore could be employed in the semiconductor device according to FIG. 13 as well. According to one embodiment, the individual field electrode structures 20 are implemented in the same way. According to a further embodiment, different field electrode structures 20 are employed in one semiconductor device.

In the semiconductor device according to FIG. 13, the individual field electrode structures 20 are in line with each other in the current flow direction x. The optional shielding structure 25 is arranged between the field electrode structure 20 arranged closest to the junction 12 and the junction 12. For the remaining field electrode structures 20 a neighboring field electrode structure, in particular the field electrode dielectric 22 of the neighboring field electrode structure acts as a shielding structure, so that no additional shielding structures are required for these field electrode structures.

Referring to what is illustrated in dotted lines in FIG. 13, the semiconductor device may include a charge carrier trap 27 for charge carriers of a charge carrier type complementary to the charge carriers trapped in the field electrode 21 when the junction 12 is reverse biased. In particular when the field electrode structure 20 includes a generation region those complementary charge carriers are generated when the field electrode 21 is charged or biased. In the embodiment illustrated in FIG. 13, the charge carrier trap 27 is arranged at the field electrode dielectric at that longitudinal end of the field electrode that faces away from the opening 26. The charge carrier trap may include a curved surface (as illustrated in FIG. 13) that faces the opening 26 of a neighboring field electrode structure 20, or may include a plane surface (not illustrated). The charge carrier trap 27 may be formed as a section of the field electrode dielectric 22 and may include the same material as the field electrode dielectric 22. One charge carrier trap 27 formed at one end of one field electrode structure traps charge carriers generated in a generation region (not shown in FIG. 13) of a neighboring field electrode structure. The shielding structure adjacent the field electrode structure 20 that is closest to the junction 12 may act as a charge carrier trap for complementary charge carriers generated in this field electrode structure 20.

Figure 14:
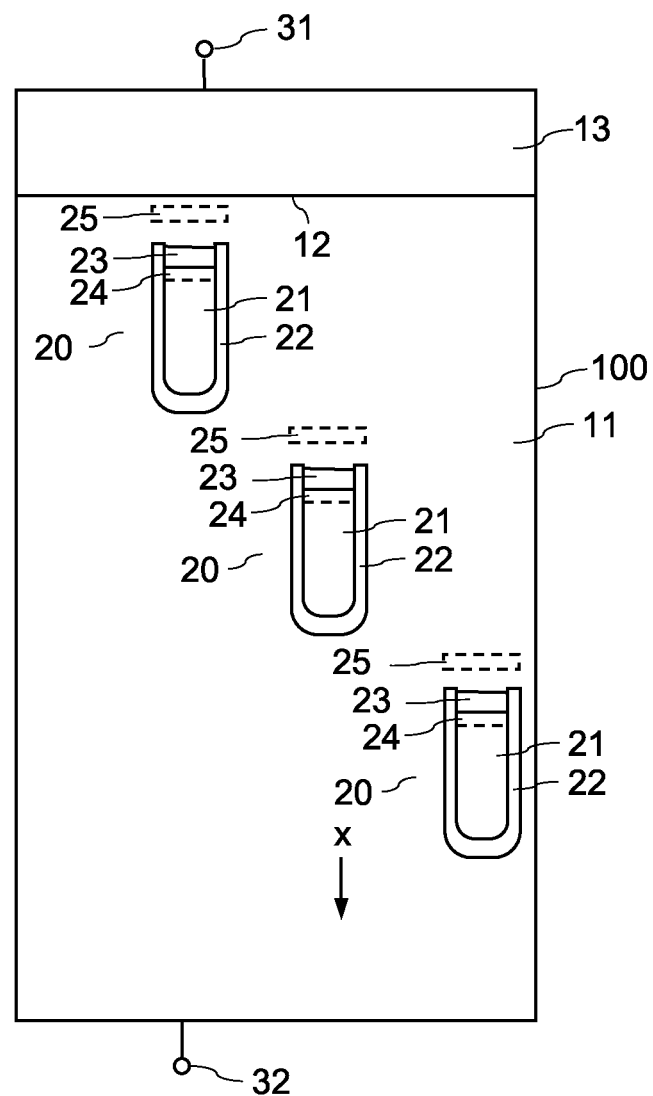
FIG. 14 illustrates a cross sectional view of a semiconductor device according to a second embodiment that includes a plurality of field electrode structures arranged offset in a direction perpendicular to the current flow direction.

FIG. 14 illustrates a further embodiment of a semiconductor device with a plurality of field electrode structures. In this semiconductor device the individual field electrode structures 20 are also arranged distant in the current flow direction x. However, the individual field electrode structures 20 are not in line with each other but are offset in a direction perpendicular to the current flow direction x. According to one embodiment, the structure illustrated in FIG. 14 is employed as an edge termination structure in a vertical semiconductor device. In this case, the structure with the offset field electrode structure is arranged in an edge region of the semiconductor body 10, which is a region of the semiconductor body close to a (vertical) edge of the semiconductor body 100. Especially when used as an edge termination structure, the optional shielding structures adjacent the individual field electrode structures can be omitted.

Figure 15:
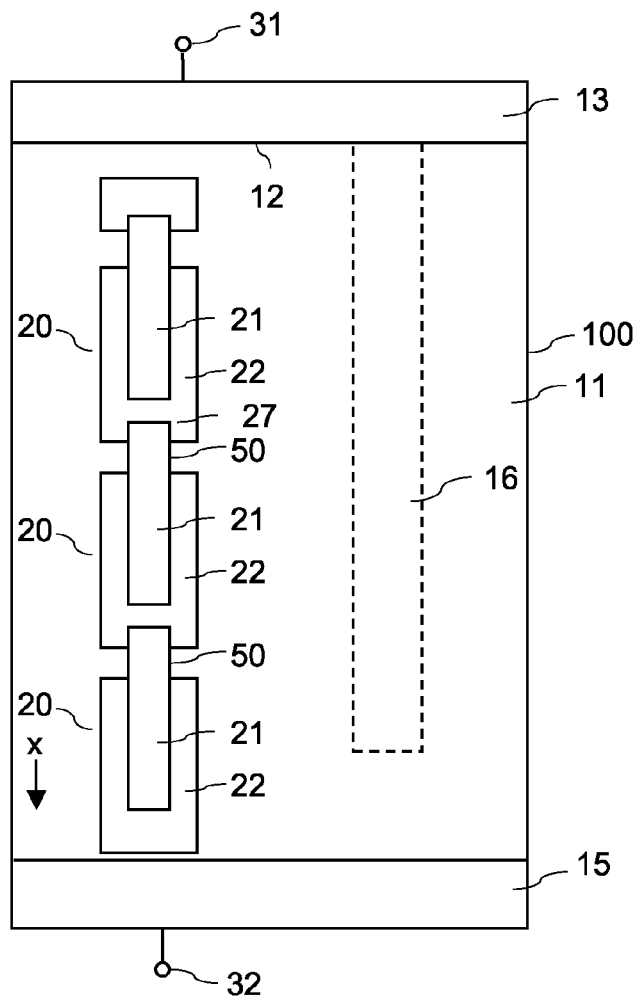
FIG. 15 illustrates a further embodiment of a semiconductor device including a plurality of field electrode structures.

FIG. 15 illustrates a further embodiment of a semiconductor device that includes a plurality of field electrode structures 20. In this semiconductor device, a generation region 50 is formed between the field electrode 21 and the drift region 11 and/or within the field electrode 21. Further, the field electrode 21 of a field electrode structure 20 arranged closest to the junction 12 extends to a shielding structure 25. The field electrodes 21 of the other field electrode structures 20 in the current flow direction x extend to or into the field electrode dielectric 22 of a neighboring field electrode structure 20. Those regions of the field electrode dielectric 22 of one field electrode structure 20 to which or into which the field electrode 21 of a neighboring field electrode structure extends form a charge carrier trap 27 form complementary charge carriers. The generation regions 50 are interfaces between the field electrodes 21 and the drift region 11 that are distant to an outer edge of the field electrode dielectric 22 in the direction perpendicular to the current flow direction or the generation regions are arranged within the field electrodes 21. In each case, these generation regions 50 do not extend beyond the field electrode dielectric 22 in the direction perpendicular to the current flow direction.

Referring to the explanation above, the field electrode dielectric 22 basically is U-shaped, with a bottom section $22_1$ and two opposing leg sections $22_2$, $22_3$.

Figures 16A, 16B, 16C, 16D:
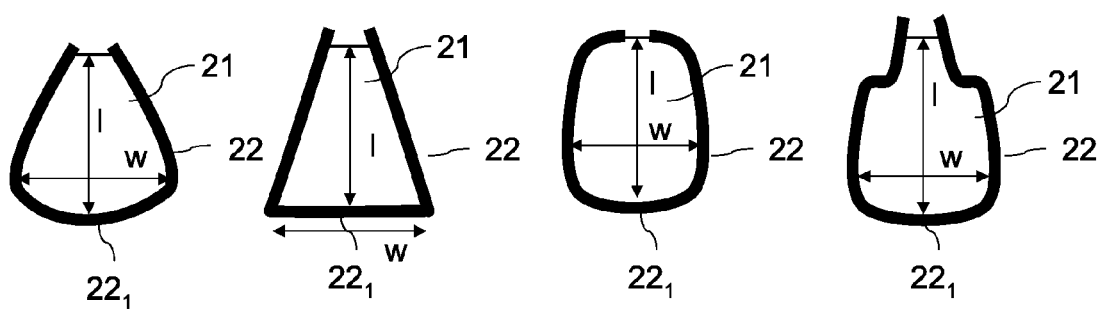
FIGS. 16A to 16D illustrates further embodiments of a field electrode and a field electrode dielectric of the field electrode structure.

Referring to FIGS. 16A to 16D this U-shape may be modified in many different ways. FIGS. 16A to 16D schematically illustrate embodiments of possible forms or geometries of the field electrode dielectric 22. Referring to FIGS. 16A and 16B the field electrode 21 and, therefore, the U-shape of the field electrode dielectric 22 may narrow in the direction of the opening 26. In the embodiment illustrated in FIG. 16C, the field electrode 21 has approximately a constant width, wherein the field electrode dielectric 22 only narrows in a region close to the opening 26. Referring to FIG. 16D the field electrode dielectric 22 could also be bottle-shaped. FIGS. 16A to 16D illustrate only several of many possible ways in which the U-shape of the field electrode dielectric 22 can be modified.

Figure 17:
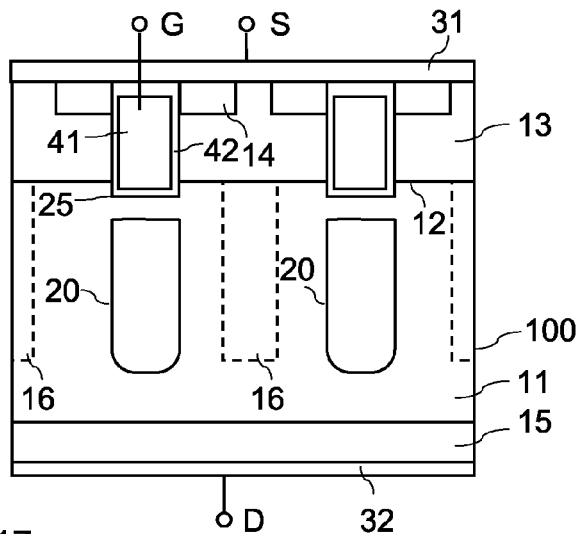
FIG. 17 illustrates a first embodiment of a semiconductor device implemented as a transistor.

FIG. 17 illustrates a cross sectional view of a semiconductor device with a field electrode structure implemented as an MOS transistor. In FIG. 17, as well as in FIGS. 18 to 21, the field electrode structures 20 are only schematically illustrated. Each of the field electrode structures explained with reference to FIGS. 1 to 16 herein below may be employed in these semiconductor devices. Referring to FIG. 17, the further device region 13 forms a body region of the MOS transistor and is doped complementarily to the drift region 11. The junction 12 between the drift region 11 and the body region 13 is a pn junction in this device. The MOS transistor further includes a source region 14 and a drain region 15. The body region 13 is arranged between the source region 14 and the drift region 11, and the drift region 13 is arranged between the body region 13 and the drain region 15. A gate electrode is adjacent to the body region 13 and is dielectrically insulated from the body region 13 by a gate dielectric 42.

The MOS transistor can be implemented as an enhancement transistor (normally-off transistor). In this case, the body region 13 adjoins the gate dielectric 42. The semiconductor device could also be implemented as a depletion transistor (normally-on transistor). In this case, a channel region (not shown) of the same doping type as the source region 14 and the drift region 11 extends between the source region 14 and the drift region 11 along the gate dielectric 42 in the body region 13.

The MOS transistor can be implemented as an n-type transistor. In this case, the source region 14 and the drift region 11 are n-doped, while the body region 13 is p-doped. The semiconductor device could also be implemented as a p-type transistor. In this case, the source region 14 and the drift region 11 are p-doped, while the body region 13 is n-doped. Further, the MOS transistor can be implemented as a MOSFET or as an IGBT. In a MOSFET, the drain region 15 is of the same doping type as the drift region 11, while in an IGBT the drain region 15 is doped complementarily. In an IGBT the drain region is also referred to as collector region instead of drain region.

The MOS transistor according to FIG. 17 can be implemented as a vertical transistor. In this case, the source region 14 and the drain region 15 are arranged distant in a vertical direction of the semiconductor body 100, the vertical direction being a direction perpendicular to first and second surfaces of the semiconductor body 100. In a vertical transistor the current flow direction x corresponds to the vertical direction of the semiconductor body 100. However, the transistor could also be implemented as a lateral transistor. In this case, the source region 14 and the drain region 15 are arranged distant in a lateral or horizontal direction of the semiconductor body, so that source and drain electrodes of the transistor are arranged on one side of the semiconductor body. In the MOS transistor according to FIG. 17, the first electrode 31 forms a source electrode that contacts the source and body regions 14, 13 and that is connected to a source terminal S, while the second electrode 32 forms a drain electrode that is electrically connected to a drain terminal D. The gate electrode 41 is electrically connected to a gate terminal G. Like a conventional transistor the transistor according to FIG. 17 may include a plurality of identical transistor cells, with each transistor cell including a source region 14, a body region 13 and a section of the gate electrode 41. The drift region 11 and the drain region 15 can be common to the individual transistor cells. The individual transistor cells are connected in parallel in that the individual source regions 14 are connected to the source electrode 31 and in that the individual gate electrodes 41 are connected to a common gate terminal G.

In the transistor device according to FIG. 17 the field electrode structures 20 are in line with the gate electrode 41 and the gate dielectric 42 in the current flow direction x. The geometry of the field electrodes (not illustrated in FIG. 17) in a plane perpendicular to the plane illustrated in FIG. 17 may correspond to the geometry of the gate electrode 41 in this plane. In the semiconductor device according to FIG. 17 only one field electrode structure 20 is arranged in line with one gate electrode or gate electrode section 41. However, this is only an example. Referring to the embodiments illustrated in FIGS. 13 to 15 a plurality of field electrode structures 20 may be arranged in line with each other in the current flow direction x.

In the embodiment according to FIG. 17, in which the field electrode structures 20 are arranged in line with the gate electrodes and the gate dielectric 42, the gate electrode and the gate dielectric act as a shielding structure 25 and/or as a charge carrier trap, so that no additional shielding structure is required.

The MOS transistor according to FIG. 17 can be operated like a conventional MOS transistor that can be switched on and off by applying a suitable drive potential to the gate electrode 41. When the MOS transistor is switched off and a voltage is applied between the drain and source terminals D, S that reverse biases the pn junction between the drift region 11 and the body region 13, field electrodes (not shown in FIG. 17) of the field electrode structures 20 are biased as explained before so as to provide counter charges to dopant charges in the drift region 11.

Figure 18:
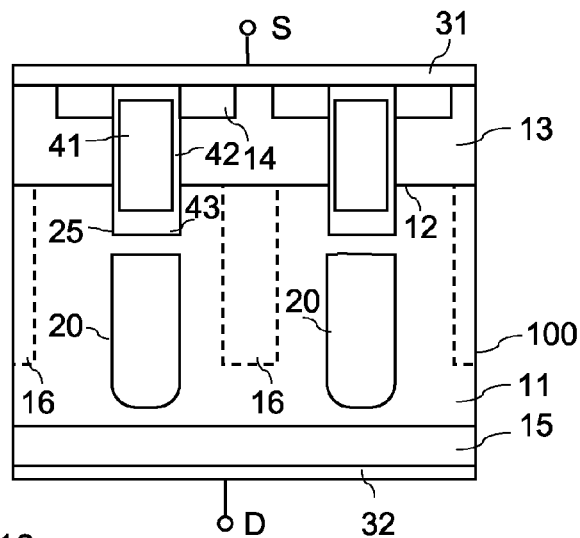
FIG. 18 illustrates a second embodiment of a semiconductor device implemented as a transistor.

FIG. 18 illustrates a further embodiment of a semiconductor device implemented as an MOS transistor. The semiconductor device of FIG. 18 is a modification of the semiconductor device of FIG. 17, where in the embodiment of FIG. 18 a dielectric layer 43 between the gate electrode 41 and the drift region 11 is thicker than the gate dielectric 42. The thickness of this dielectric layer is, for example, between 100-nm and 500 nm.

Figure 19:
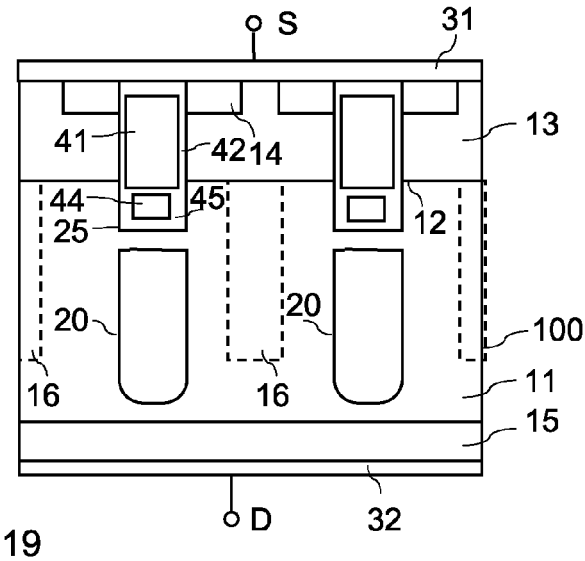
FIG. 19 illustrates a third embodiment of a semiconductor device implemented as a transistor.

FIG. 19 illustrates a further modification of the semiconductor device illustrated in FIG. 17. The semiconductor device of FIG. 19 includes a further field plate or field electrode 44. This further field electrode 44 is dielectrically insulated from the drift region 11 by a further field electrode dielectric 45. The further field electrode 44 is electrically connected to the source terminal S or the gate terminal G in a manner not illustrated in FIG. 19 and includes, for example, a metal or a polycrystalline semiconductor material. In the embodiment illustrated in FIG. 19, the further field electrode 44 is formed in the same trench as the gate electrode 41, so that the further field electrode 44 is in line with the gate electrode 41. However, this is only an example. The further field electrode 44 and the gate electrode 41 could also be implemented in different trenches.

In the embodiments illustrated in FIGS. 17 to 19, the gate electrode 41 is implemented as a trench electrode that is arranged in a trench of the semiconductor body 100. However, this is only an example. Any other type of gate electrode geometry may be applied as well.

Figure 20:
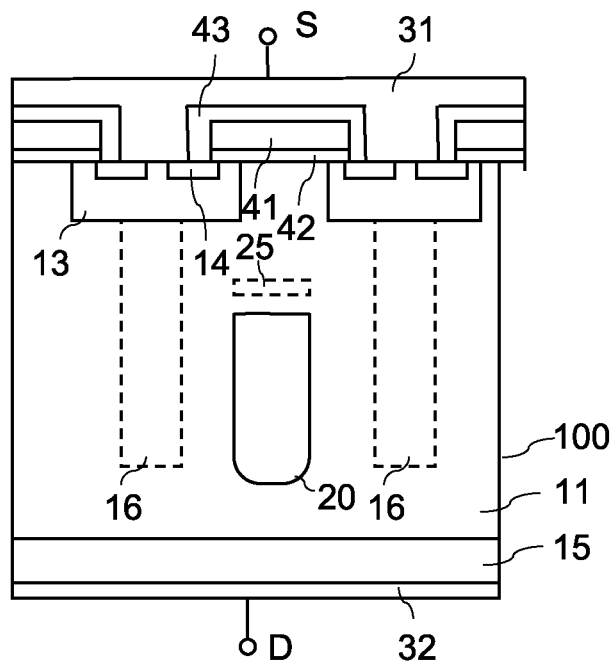
FIG. 20 illustrates a fourth embodiment of a semiconductor device implemented as a transistor.

FIG. 20 illustrates a cross sectional view of a vertical transistor device with a planar gate electrode 41, which is a gate electrode arranged above a surface of the semiconductor body 100. In this embodiment, the drift region 12 includes sections that extend to the first surface of the semiconductor body 100 and to the gate dielectric 42 arranged above the first surface. The body region 13 may act as shielding structure, so that no additional shielding structure 25 is necessary.

Figure 21:
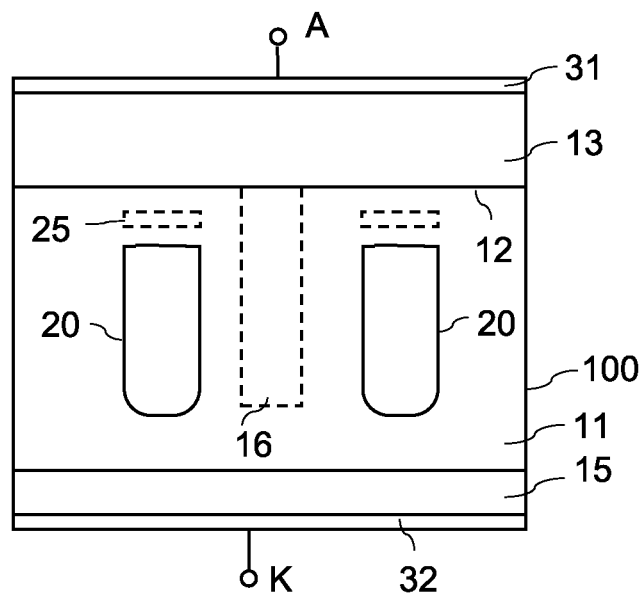
FIG. 21 illustrates an embodiment of a semiconductor device implemented as a diode.

FIG. 21 illustrates an embodiment of a semiconductor device implemented as a diode. In this semiconductor device the further device region 13 is either a semiconductor region of a doping type complementary to the drift region 11, so as to form a bipolar diode, specifically a p-i-n diode, or the further device region 13 is a Schottky region, so as to form a Schottky diode. The further device region forms a first emitter region of the diode. The diode further includes a second emitter region 15 of the same doping type as the drift region 11 but more highly doped. The second emitter region 13 is connected to the first electrode 31 that forms an anode terminal, and the emitter region 14 is connected to the second electrode 32 that forms a cathode terminal K of the diode in this embodiment.

The diode according to FIG. 21 can be operated like a conventional diode. When a voltage is applied between the anode and cathode terminals A, K that reverse biases the pn junction between the drift region 11 and the first emitter region 13, field electrodes (not shown in FIG. 17) of the field electrode structures 20 are biased as explained before so as to provide counter charges to dopant charges in the drift region 11.

Referring to the explanation above, electric charges are stored in the field electrode structures 20 when the semiconductor device is switched into an off-state. Charges stored in the field electrode structures 20 have corresponding charges in the form of ionized dopant atoms in the drift region 11. When the semiconductor device switches off and when there are several field electrodes arranged adjacent in the current flow direction of the drift region 11, the individual field electrodes 21 are subsequently charged as the depletion region expands in the drift region 11 and as the voltage across the drift region 11 increases. Thus, field electrodes closer to the pn junction 12 are charged before field electrodes more distant to the pn junction 12 are charged.

Storing charges in the field electrodes 21 and the drift region 11, respectively, requires electric energy. This energy, often referred to as $E_{OSS}$, is dependent on the total amount of electrical charge stored in the semiconductor device and is dependent on the voltage at which these charges are stored. For storing charges in a field electrode 21 close to the pn junction less energy is required than for storing the same amount of charges in a field electrode more distant to the pn junction, because the field electrode 21 more distant to the pn junction 12 is charged when the voltage across the drift region 11 has increased to higher values. The energy required to store charges in the semiconductor device at the time of switching off contributes to the switching losses of the semiconductor device.

In order to reduce the switching losses, the semiconductor device optionally includes a compensation region 16 of a second doping type complementary to the first doping type of the drift region 11. The compensation region 16 is arranged in the drift region 11 so that there is a pn junction between the drift region 11 and the compensation region 16. Further, the compensation region 16 is electrically coupled to the device region 13. Compensation regions 16 are schematically illustrates (in dashed lines) in the semiconductor devices illustrated in FIGS. 13, 15 and 17 to 21. In these embodiments, the compensation region 16 adjoins the device region 13, which is a body region when the semiconductor device is implemented as a MOSFET. In a semiconductor device implemented with a plurality of transistor cells a compensation region 16 can be associated with each transistor cell and connected to the body region 13 of the individual transistor cell.

In the current flow direction of the semiconductor device, the compensation region 16 extends over a significant part of the length of the drift region 11. The "length" of the drift region 11 is the dimension of the drift region 11 between the pn junction 12 and the drain region or emitter region 15.

The operating principle of the compensation region 16 corresponds to the operating principle of a compensation region in a conventional superjunction semiconductor device and is explained in the following. In the on-state of the semiconductor device, the voltage across the pn junction between the drift region 11 and the compensation region 16 corresponds to the voltage between the first load terminal 31 (source terminal) connected to the device region 13 (body region) and the second load terminal 32 connected to the drain region or emitter region 15. In a MOSFET, the pn junction between the drift region 11 and the compensation region 16 is always reverse biased when the MOSFET is in a forward operation mode (which is an n-type MOSFET when a positive voltage is applied between the drain and source terminals D, S). However, when the MOSFET is in an on-state, the voltage difference between the first and second load terminals 31, 32 (source and drain terminals) is relatively low, so that there is only a small depletion region around this pn junction. In a diode, the pn junction between the drift region 11 and the compensation region 16 is forward biased when the diode is in the on-state.

When the semiconductor device is switched off so that the voltage difference between the first and second load terminals 31, 32 increases, a depletion region expands in the drift region 11 from both, the pn junction 12 between the device region 13 and the drift region 11 and from the pn junction between the drift region 11 and the compensation region 16. Referring to the explanation above, the expansion of the depletion region involves storing charges in the drift region 11 in the form of ionized dopant atoms. Since the compensation region 16 extends deep into the drift region 11 and since the area of the pn junction between the drift region 11 and the compensation region 16 is large relative to the area of the pn junction between the drift region 11 and the device region 13, large parts of the volume of the drift region 11 become depleted at low voltages between the load terminals 31, 32, which means at voltages before the depletion region expanding from the pn junction 12 between the drift region 11 and the device region 13 reaches the first field electrode structure 20. Thus, switching losses are reduced by virtue of providing the compensation region 16.

Different from conventional superjunction devices, that only include a drift region and a compensation region and that do not include a field electrode structure as explained herein above, an exact balance of dopant atoms in the drift region and the compensation region is not necessary. In conventional superjunction devices the overall number of dopant atoms in the drift region should correspond to the overall number of dopant atoms in the compensation region so that each dopant atom in the drift region finds a corresponding dopant atom in the compensation region. In the semiconductor devices explained herein before, however, the overall number of dopant atoms in the drift region 11 can be higher than the overall number of dopant atoms in the compensation region 16, because the field electrode structures 20 additionally provide for a compensation effect.

Referring to the explanation hereinbefore, a space charge region (depletion region) expands in the drift region 11 when the junction between the drift region 11 and the device region 13 is reverse biased (and when in case of an MOS transistor a conducting channel between the source region 14 and the drift region 11 is interrupted). As the voltage that reverse biases the junction 12 increases the space charge region, as seen from the junction 12, expands deeper into the drift region 11. When the space charge region reaches a field electrode structure 20, the corresponding field electrode 21 is charged (in the way explained before) so as to provide a counter charge to ionized dopant atoms in the drift region 11. Charging the individual field electrodes 21 requires a current to flow into the semiconductor device. That is, after the semiconductor device has been reverse biased a current flows into the semiconductor device to charge the field electrodes 21. Charging the field electrodes involves losses, wherein the overall energy (that is usually referred to as $E_{OSS}$) dissipated in the semiconductor device when it switches from the on-state to the off-state (or vice versa) are given by:

$$E_{OSS} = \int V_{DS} \cdot I_{DS} dt, \qquad (1)$$

where $V_{DS}$ is the voltage between the first and second terminals 31, 32 when the device switches from the on-state to the off-state, where $I_{DS}$ is the current flowing into the device during the transition from the on-state to the off-state, and wherein the product of the voltage $V_{DS}$ and the current $I_{DS}$ is integrated for a time period during which the device switches from the on-state to the off-state. During the transition from the on-state to the off-state the voltage $V_{DS}$ increases from several volts to the blocking voltage that is finally supported by the device. This blocking voltage can be up to several hundred volts. Equivalent losses occur when the device switches from the off-state to the on-state, that is when the field electrodes 21 are discharged.

In a semiconductor device that includes several field electrode structures 20 that are spaced in the current flow direction (as illustrated, for example, in FIGS. 13-15) those field electrode structures that are close to the junction 12 (and that are reached by the space charge region first) have their field electrode 21 charged when the voltage $V_{DS}$ between the terminals 31, 32 is relatively low, while those field electrode structures that are located more distant to the junction 12 (that is, closer to the drain or emitter region 15) have their field electrode 21 charged when the voltage $V_{DS}$ between the terminals 31, 32 is already relatively high. If approximately the same amount of electrical charge is required to charge each of the individual field electrodes, then the energy required to charge those field electrodes that are more distant to the junction 12 and that are charged when the voltage $V_{DS}$ is already relatively high is higher than the energy required to charge those field electrodes that are closer to the junction 12 and that are charged when the voltage $V_{DS}$ is relatively low.

In order to reduce the overall switching losses that occur when the device switches from the on-state to the off-state (or from the off-stat to the on-state) it is desirable to have a semiconductor device in which those field electrodes 21 that are more distant to the junction 12 than other field electrodes 21 are charged/discharged when the voltage $V_{DS}$ across the device is still/already relatively low. One embodiment of such semiconductor device is shown in FIGS. 22 to 24.

Figure 22:
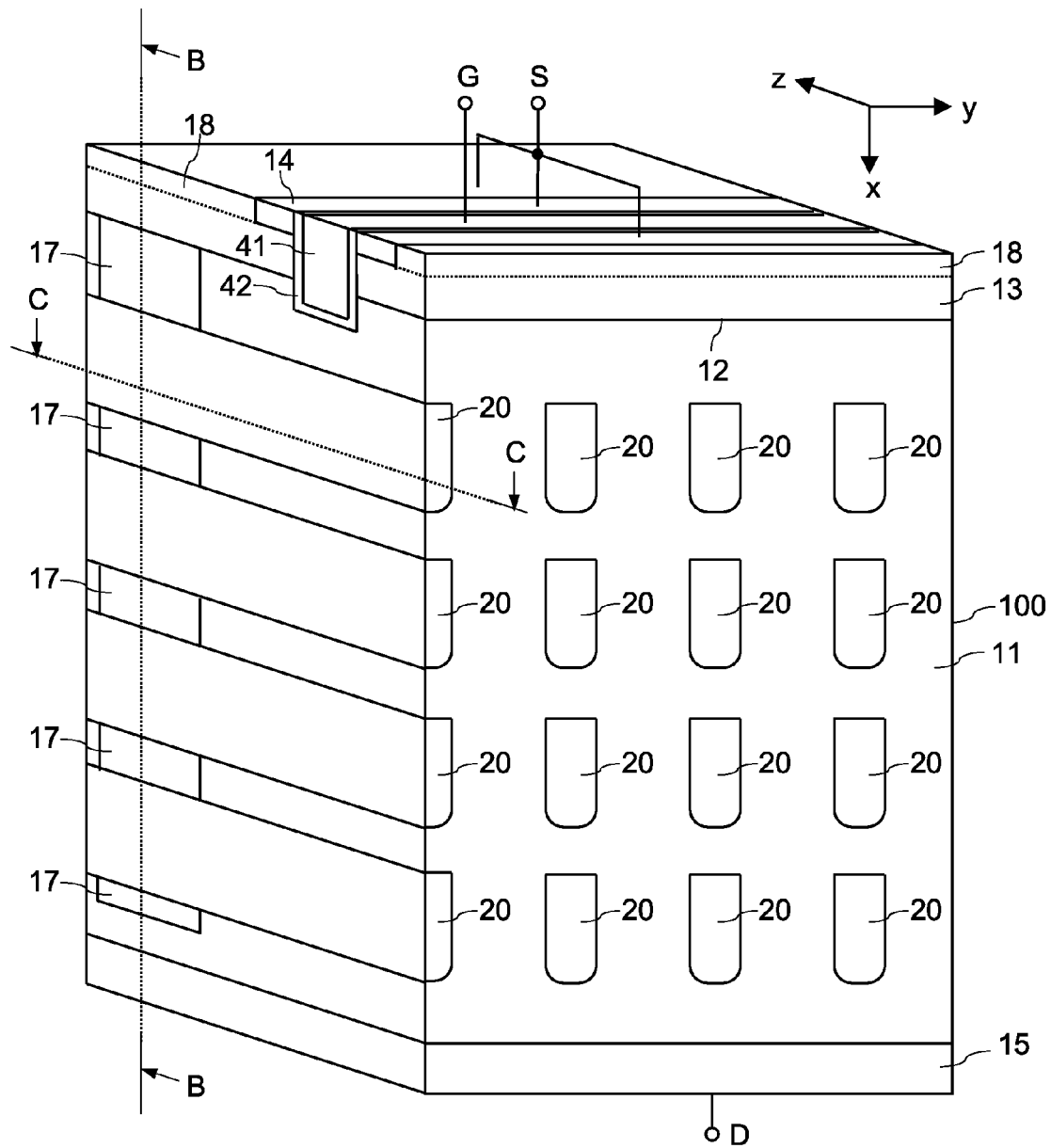
FIG. 22 illustrates a vertical cross sectional view of one embodiment of a semiconductor device that includes a coupling region that is coupled to a device region, and adjoins the at least one field electrode structure.

FIG. 22 shows a perspective cross sectional view of a semiconductor device that includes a plurality (at least two) field electrode structures 20 that are spaced in the current flow direction x. FIG. 23 shows a vertical cross sectional view of the semiconductor device in vertical section plane B-B shown in FIG. 22, and FIG. 24 shows a horizontal cross sectional view of the semiconductor device in vertical section plane C-C shown in FIG. 22. The semiconductor device illustrated in FIGS. 22 to 24 is implemented as a transistor device, specifically as a vertical MOSFET. However, this is only an example, the semiconductor device could be implemented as a bipolar diode or a Schottky diode as well. Further, it is possible to implement the semiconductor device as a lateral semiconductor device instead of a vertical semiconductor device as well.

Figure 23:
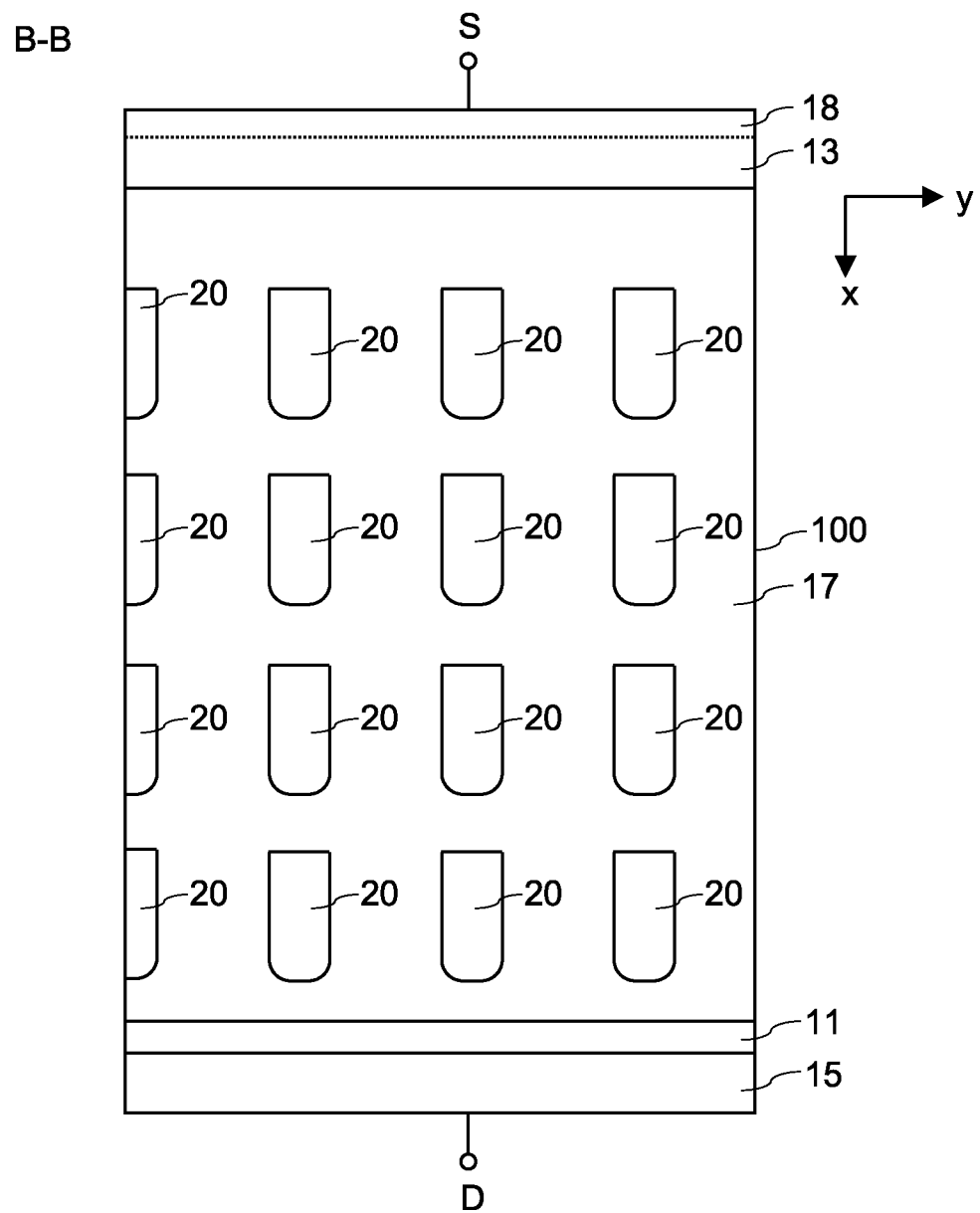
FIG. 23 illustrates a vertical cross sectional view of the semiconductor device shown in FIG. 22.
Figure 24:
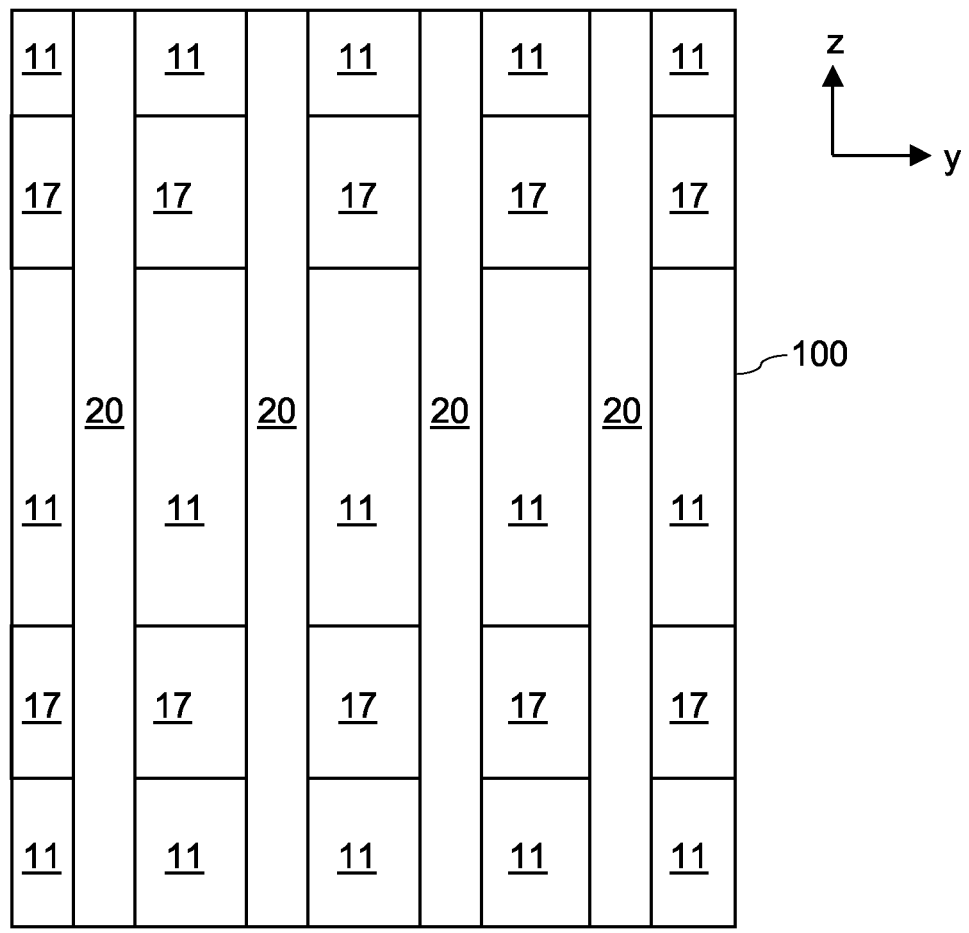
FIG. 24 illustrates a horizontal cross sectional view of the semiconductor device shown in FIG. 22.

In the transistor device shown in FIGS. 22 to 24, the device region 13 is a body region that adjoins a drift region 11. Further, the transistor device includes at least one device cell with a body region 13, a source region 14, and a gate electrode 41. The gate electrode 41 is dielectrically insulated from the body region 13 by a gate dielectric 42, and the body region 13 is arranged between the drift region 11 and the source region 14. Referring to FIG. 22, the source region 14 and the body region 13 are connected to a source terminal S. Optionally, the source terminal S contacts the body region 13 via a higher doped contact region 18 of the same doping type as the body region 13. A doping concentration of the higher doped region 18 can be such that there is an ohmic contact between a source electrode (not shown in FIG. 22) that forms the source terminal S (or is connected to the source terminal S) and the contact region 18.

The transistor device may include a plurality of device cells (in FIG. 22 only one of those device cells is shown) that are connected in parallel by having their gate electrodes 41 connected to the gate terminal G, and by having their source regions 14 connected to the source terminal S. The individual device cells may have the drift region 11 and the drain region 15 in common. The details explained with reference to embodiments herein before concerning a doping type and a doping concentration of the source region 14, the body region 13, the drift region 11, and the drain region 15) apply to the transistor device of FIG. 22 as well.

Referring to FIG. 22, the semiconductor device further includes a coupling region 17 of a second doping type complementary to the first doping type of the drift region 11. This coupling region 17 is electrically coupled to the body region 13 (the device region) and forms a pn-junction with the drift region 11. The field electrode structures 20, that are only schematically illustrated in FIG. 22, can be implemented in accordance with any of the embodiments explained herein before. Referring to the embodiments explained with reference to FIGS. 1 to 21 herein before, the individual field electrode structures 20 each include a field electrode 21, a field electrode dielectric 22, and at least one of a generation region 50, and a field stop region 23. The coupling region 17 is coupled to field electrodes 21 of the individual field electrode structures 20. For this, the coupling region 17 may adjoin at least one of the field electrode 21, and the field electrode dielectric 22, the field stop region 23, and the generation region 50. In the first case, the coupling region is directly electrically coupled to the field electrode 21. In the second case, the coupling region 17 is capacitively coupled to the field electrode 21 through the field electrode dielectric 22. The coupling of the coupling region 17 to the individual field electrodes 21 is explained in further detail with reference to FIG. 26 below.

Referring to FIGS. 22 and 23, the coupling region 17 extends from the body region 13 in the current flow direction x (which is the vertical direction of the semiconductor body 100 in this embodiment) into the drift region 11 and to the field electrode structure 20 that is most distant to the junction 12, so that the field electrode 21 of each of the field electrode structures 20 is coupled to the coupling region 17.

In the embodiment shown in FIG. 22, the gate electrode 41 of the device cell is an elongated trench electrode that extends in the second lateral direction y. However, this is only an example. It is also possible to implement the gate electrode as a planar electrode on top of the semiconductor body 100, or to implement the device cell with a trench electrode that has a pile-shape.

In the embodiment shown in FIGS. 22 to 24, the individual field electrode structures 20 are elongated structures that longitudinally extend in a first lateral direction z of the semiconductor body 100. In the present embodiment, there are a plurality of field electrode structure that are mutually spaced in a horizontal direction perpendicular to the first lateral direction z. In this embodiment, the coupling region 17 is also elongated and longitudinally extends in a second lateral direction y that is different from the first lateral direction z. According to one embodiment, the second lateral direction y is perpendicular to the first lateral direction z, so that there is an angle of 90° between the first and second lateral directions z, y. However, it is also possible to implement an elongated coupling region 17 and elongated field electrode structures 20 such that an angle between the coupling region 17 and the field electrode structures 20 is less than 90°, for example, between 30° and 90°.

In an embodiment in which the gate electrode 41 is an elongated trench electrode, a longitudinal direction of the trench electrode can be substantially parallel to the second lateral direction y. In this case, the gate electrode 41 is substantially parallel to the coupling region 17.

Referring to FIG. 24, there can be two or more coupling regions 17 (or two ore more sections of one coupling region) that are distant in the first lateral direction z and that are each coupled to the device region 13 (body region). In the embodiment shown in FIG. 24, the coupling regions 17 are elongated coupling regions that are substantially parallel. However, it is also possible to implement elongated coupling regions such that they are not parallel (so that one cuts through the other).

According to a further embodiment, the semiconductor device includes several pile-shaped coupling regions 17.

Figure 25:
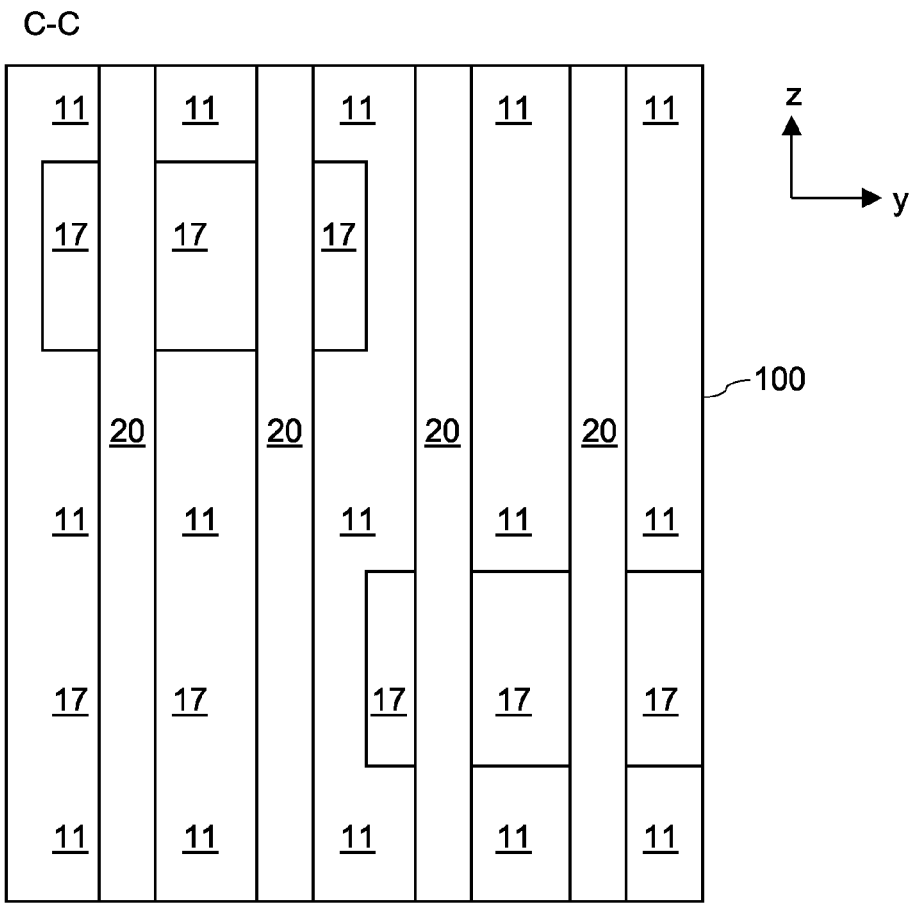
FIG. 25 illustrates a horizontal cross sectional view of a semiconductor device according to a further embodiment.

FIG. 25 illustrates a horizontal cross sectional view of a semiconductor device with pile shaped coupling regions 17. In this embodiment, the individual coupling regions 17 have a substantially rectangular cross section. However, this is only an example. These coupling regions could be implemented with a different cross section, such as an elliptical cross section, or a polygonal cross section as well.

According to yet another embodiment (not shown), the coupling region 17 has the form of a grid in the horizontal plane (such as the section plane C-C shown in FIGS. 24 and 25) of the semiconductor body 100.

In the embodiment illustrated in FIGS. 22 to 24 and 25, the coupling region 17 adjoins each of the field electrode structures 20 so that the coupling region 17 is coupled to the field electrode of each of the field electrode structures. However, this is only an example. According to a further embodiment (not shown), the coupling region 17 is coupled to the field electrodes of only some of the field electrode structures. In this case, the coupling region 17 may be coupled to the field electrodes 21 of only those field electrode structures 20 that are spaced more than a predefined distance from the junction 12. This predefined distance is, for example, be 30% or 50% of a length of the drift region 11 in the current flow direction x.

Figure 26:
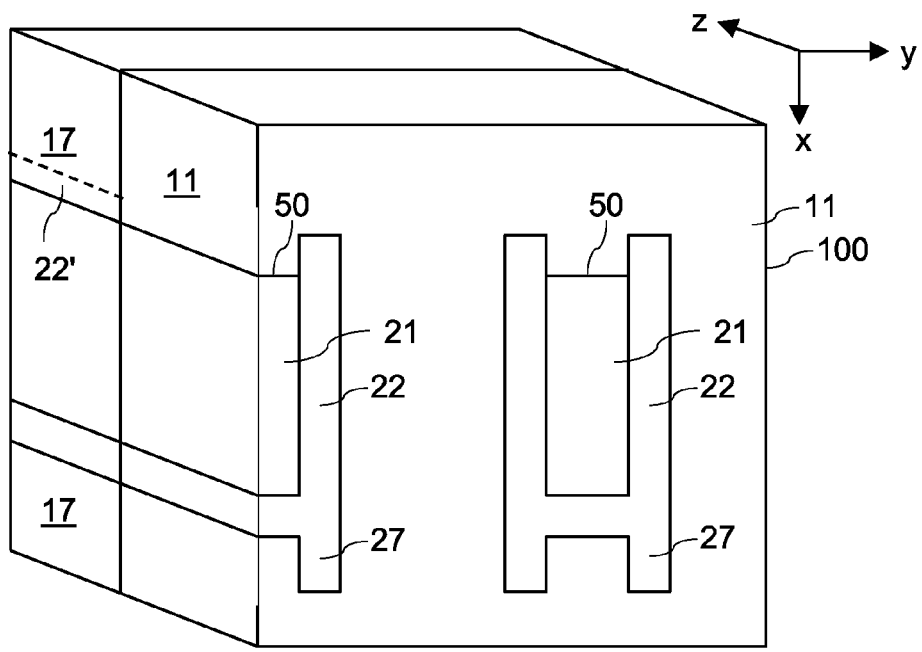
FIG. 26 illustrates one embodiment of a field electrode structure of the semiconductor device shown in FIGS. 22 to 24 in detail.

FIG. 26 illustrates a section of the semiconductor device greater detail. In this section shown in FIG. 26, the coupling region 17 and the drift region 11 form a pn-junction and the coupling region 17 is coupled to the field electrode 21 of one field electrode structure 20 that is shown in a perspective sectional view in FIG. 16. Another field electrode structure is shown in a vertical cross sectional view in FIG. 26. In the embodiment shown in FIG. 26, each field electrode structure 20 includes a field electrode 21 that is selected such that a junction between the field electrode 21 and the drift region 11 forms a generation region 50 between the field electrode 21 and the drift region 11. This has been explained before in connection with FIG. 7 to which reference is made so that the field electrode 21 may include one of the materials explained in connection with reference to FIG. 7. According to a further embodiment, the field electrode 21 includes a monocrystalline semiconductor material of a doping type complementary to the doping type of the drift region 17.

In the embodiment illustrated in FIG. 26, the coupling region 17 adjoins the field electrode 21, so that the field electrode 21 is directly coupled to the coupling region 17.

The operation mode of a semiconductor device as shown in FIGS. 22 to 24 and 25 and including a field electrode structure 20 as shown in FIG. 26 is explained below. However, this operation mode equivalently applies to embodiments with other field electrode structures as well. For explanation purposes it is assumed that the semiconductor device is an n-type MOSFET with an n-doped drift region 11, n-doped source and drain regions 14, 15, a p-doped body region 13, and a p-doped coupling region 17 that is coupled to the p-doped body region 13.

In the on-state, when a positive voltage is applied between the second load terminal 32 (drain terminal D) and the first load terminal 31 (source terminal S), the voltage between the drift region 11, that is connected to the drain terminal D through the drain region 15, and the coupling region 17, that is connected to the source terminal S via the body region 13, corresponds to the voltage between the drain and source terminals D, S. Since the voltage between the drain and source terminals D, S is relatively low when the semiconductor device is in the on-state, there are no significant depletion regions in the drift region 11 along the pn-junction between the drift region 11 and the coupling region 17 when the device is in the on-state.

When the semiconductor device is switched off, the voltage between the first and second load terminals 31, 32 and, consequently, between the drift region 11 and the coupling region 17 increases. This voltage between the drift region 11, that is coupled to the field electrode 21 through the generation region 50, and the coupling region 50 that is coupled to the field electrode 21 causes an electric field in the field electrode 21, wherein this electric field causes the generation region 50 to generate two types of charge carriers, namely n-type charge carriers (electrons) accumulating in the field electrode 21, and p-type charge carriers emitted into the drift region 11. The n-type charge carriers are counter charges to ionized (n-type) dopant atoms in the drift region 11. This corresponds to the operating principle of the semiconductor devices including a generation region 50 explained herein before, with the difference that in the individual field electrode structures 20 shown in FIGS. 22 to 26 that have a field electrode 21 coupled to the body region 13 through the coupling region 17, the generation of charge carriers and, therefore, a charging of the individual field electrodes 21 already starts when the voltage that reverse biases the junction 12 is relatively low.

In the semiconductor device(s) of FIGS. 22 to 26, the individual field electrode structures 20 are coupled to the body region 13 via the coupling region 17 and to the drain region 15 via the drift region 11. Thus, at the beginning of the switch-off process, the voltages across the individual field electrode structures 20 are approximately the same, so that in each of the field electrode structures 20 counter charges are generated at an early stage of the switch-off process, which means at low load voltages.

In the semiconductor device according to FIGS. 22 to 26 a large volume of the drift region 11 is depleted at relatively low voltages between the first and second load terminals 31, 32, so that switching losses are low. Counter charges to ionized dopant atoms in the drift region 11 are provided through the coupling region 17 and through the field electrode structures 20, so that no doping charge balance between the drift region 11 and the coupling region 17 is required.

In the embodiment shown in FIG. 26, the coupling region 17 adjoins the field electrode 21 so that the coupling region 17 is directly coupled to the field electrode 21 and couples the electrical potential of the coupling region 17 (which, at the beginning of the switching process, is the source potential) to the field electrode 21. According to a further embodiment, the coupling region 17 does not adjoin the field electrode 21, but is capacitively coupled to the field electrode 21 through the field electrode dielectric 22 and/or through another dielectric layer that separates the field electrode 21 from the coupling region 17. Such other dielectric layer 22' is shown in dashed lines in FIG. 26. The operating principle of a semiconductor device in which the coupling region 17 is only capacitively coupled to the field electrode 21 corresponds to the operating principle explained herein before of a semiconductor device in which the coupling region is directly coupled to the field electrode 21.

Figure 27:
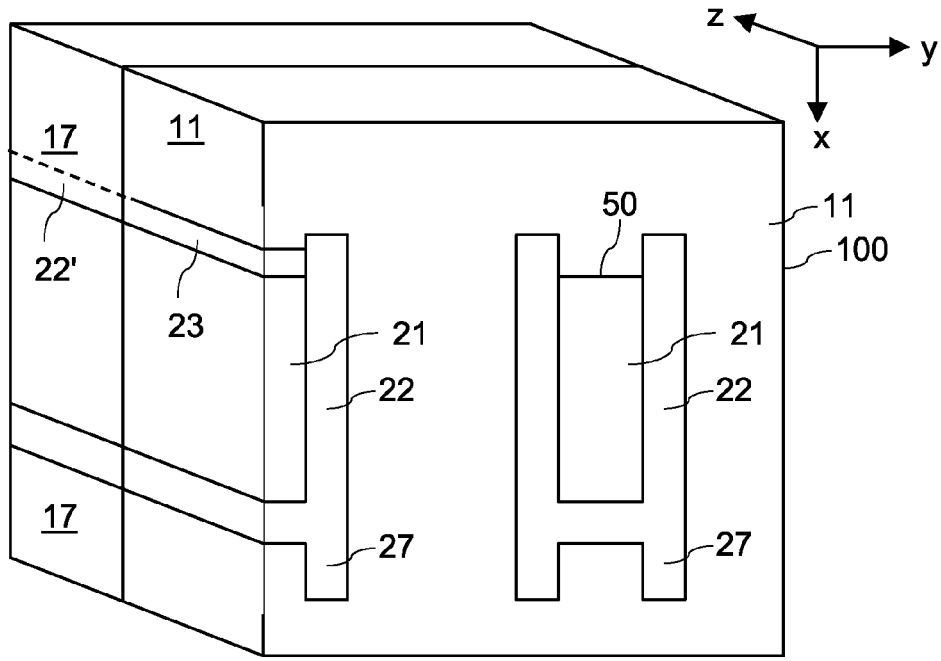
FIG. 27 illustrates a further embodiment of a field electrode structure of the semiconductor device shown in FIGS. 22 to 24 in detail.

This operating principle equivalently applies to a semiconductor device in which the field electrode structure 20 includes a field stop region 23 additionally or alternatively to a generation region 50. FIG. 27 illustrates a perspective sectional view corresponding to the sectional view shown in FIG. 26, with the difference that the field electrode structure 20 shown in FIG. 27 includes a field stop region 23 that couples the field electrode 21 to the drift region 11 instead of a generation region 50. The field stop region 23 and the field electrode 21 can be implemented in accordance with any of the embodiments explained herein before. Like in these embodiments, the field stop region 23 generates charge carriers that are accumulated in the field electrode 21 when a space charge region reaches the field stop region 23. The difference between these embodiments and the embodiment of FIG. 27 is that in the embodiment of FIG. 27 a space charge region (an electrical field) reaches the field stop region 23 when the voltage between the terminals 31, 32 is relatively low. This is by virtue of the coupling of the field electrode 21 to the body region 13 through the coupling region. The coupling region 17 can be coupled to the field electrode 21 directly (that is, the coupling region 17 may adjoin the field electrode 21), and/or can be capacitively coupled to the field electrode.

Although only two embodiments for implementing the field electrode structures 20 have been explained with reference to FIGS. 26 and 27, it should be noted, that any of the field electrode structures 20 explained with reference to FIGS. 1 to 21 herein before can be used in a semiconductor device in which the field electrode 21 is coupled to the coupling region 17.

As the voltage that reverse biases the junction 12 further increases, a depletion region expands in the coupling region 17 and the drift region 11 until the coupling region 17 is completely depleted of charge carriers. A doping concentration of the coupling region 17 may correspond to a doping concentration of the drift region 11, but could also be higher or less than a doping concentration of the drift region 11.

According to one embodiment, the coupling region 17, the drift region 11 and the field electrode structures 20 are adapted to one another such that a voltage $U_S$ that is to be applied between the terminals 31, 32 in order to completely deplete the coupling region 17 corresponds to a voltage $U_F$ that is to be applied between the terminals 31, 32 in order to completely deplete the drift region 11 between two neighboring field electrode structures 20. That is, $$U_F = U_S \qquad (2)$$

Figure 28:
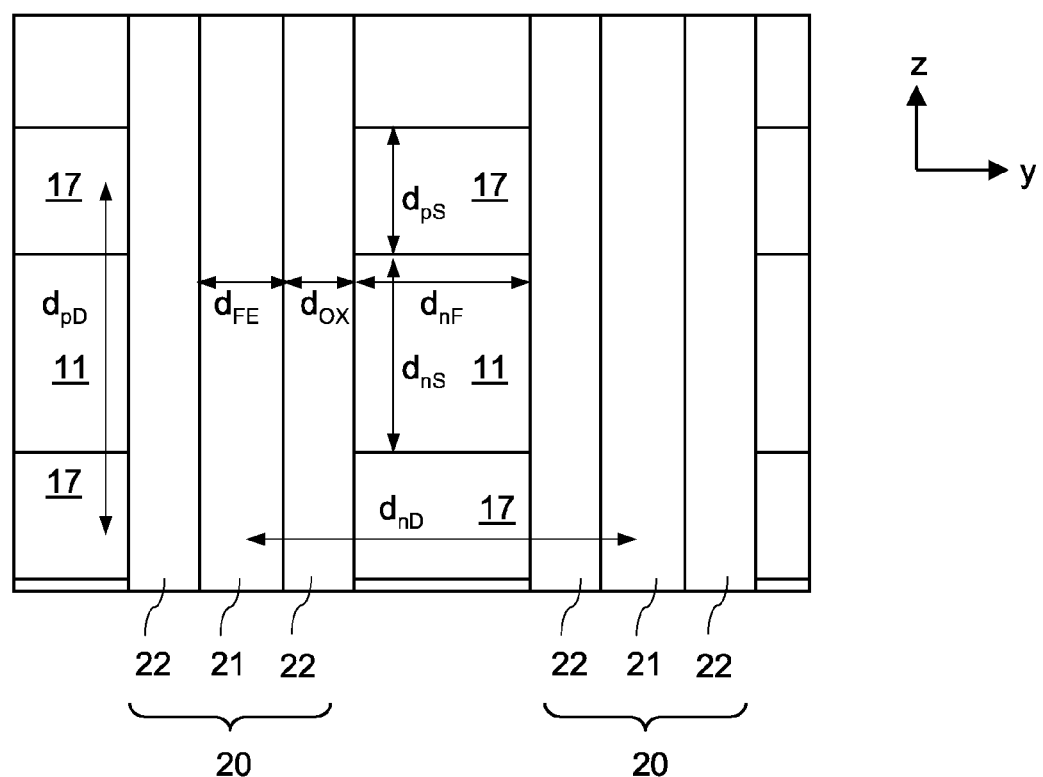
FIG. 28 illustrates an enlarged view of the horizontal cross sectional view shown in FIG. 24.

This is explained by way of example with reference to a device structure shown in FIG. 24. An enlarged view of this device structure is shown in FIG. 28. In the embodiment shown in FIG. 28, the drift region 11 includes a plurality of drift region sections, wherein each of these drift region sections is arranged between two neighboring field electrodes 20 in the second lateral direction y, and is arranged between two neighboring coupling regions 17 in the first lateral direction z. Further, the coupling region includes a plurality of coupling region sections, wherein each of these coupling region sections is arranged between two drift region sections in the first lateral z.

When the semiconductor device is operated such that the junction 12 is reverse biased so that a depletion region expands in the drift region sections 11 and the coupling region sections 17 along a pn-junction between those drift region sections 11 and coupling region sections 17, and so that the field electrodes 21 are charged, counter charges to ionized doping charges in the drift region sections 11 are provided by ionized doping charges in the coupling region sections 17, and by charges accumulated in the field electrode 21, while counter charges to ionized dopant charges in the coupling region sections are provided by ionized dopant charged in the drift region 11. A doping concentration of the coupling region 17 may correspond to the doping concentration of the drift region 11.

In the structure shown in FIG. 28, equation (2) is met when $$\left(\frac{d_{pS}}{4} + \frac{d_{nS}}{2}\right) \cdot E_S = \left(\frac{\varepsilon_{Si}}{\varepsilon_{OX}} + \frac{d_{nF}}{4}\right) \cdot E_F, \qquad (3)$$

where $d_{pS}$ is the width of the coupling region section 17 in the first lateral direction z, $d_{nS}$ is the width of the drift region section 11 in the first lateral direction z, $d_{nF}$ is the width of the drift region section 11 in the second lateral direction y, $\varepsilon_{Si}$ is the dielectric constant of the semiconductor material of the semiconductor body 100, such as silicon, and $\varepsilon_{OX}$ is the dielectric constant of the material of the field electrode dielectric 22, such as silicon oxide. $E_S$ is the electric field strength of a lateral electric field at the pn-junction between the coupling region section 17 and the drift region section 11 when the drift region section 11 and the coupling region section 17 are completely depleted, and $E_F$ is the electric field strength of a lateral electric field at a border between the field electrode dielectric 22 and the drift region section 11 when the drift region section 11 is completely depleted.

According to one embodiment, the semiconductor device is implemented such that $E_S$ equals $E_F$, that is:

$$E_S = E_F \qquad (4).$$

In this case, $$d_{pS} = 4 \cdot \frac{\varepsilon_{Si}}{\varepsilon_{OX}} \cdot d_{OX}. \qquad (5a)$$

In case the semiconductor body 100 includes silicon and the field electrode dielectric 22 includes silicon oxide, $\varepsilon_{Si}/\varepsilon_{OX} = 3$, so that $$d_{pS} = 12 \cdot d_{OX} \quad (5b).$$

In general, according to one embodiment, $$2 \cdot \frac{\varepsilon_{Si}}{\varepsilon_{OX}} \cdot d_{OX} \leq d_{pS} \leq 6 \cdot \frac{\varepsilon_{Si}}{\varepsilon_{OX}} \cdot d_{OX}, \quad (6a)$$

in particular $$3 \cdot \frac{\varepsilon_{Si}}{\varepsilon_{OX}} \cdot d_{OX} \leq d_{pS} \leq 5 \cdot \frac{\varepsilon_{Si}}{\varepsilon_{OX}} \cdot d_{OX}. \quad (6b)$$

The thickness $d_{OX}$ of the field electrode dielectric 22 is dependent on the dielectric strength of the material of the field electrode dielectric 22, and dependent on the desired maximum voltage the field electrode dielectric 22 should sustain. According to one embodiment, the field electrode dielectric 22 includes silicon oxide with a dielectric strengths of 2 MV/cm. Just for explanatory purposes it is assumed that the field electrode dielectric 22 should sustain 140V. In this case, the thickness $d_{OX}$ is at least 700 nm (nanometers). A width $d_{FE}$ of the field electrode 21 is, for example, between 5 micrometers (µm) and 10 micrometers such as 7 micrometers. The width $d_{pS}$ of the coupling region 17 can be calculated based on the thickness of the field electrode dielectric 22 using equations (5a) to (6b).

The maximum width $d_{nS}$ of the drift region 11 in the first lateral direction is, for example, between 100 micrometers and 300 micrometers.

In the embodiment shown in FIG. 28, $d_{pD}$ denotes the distance between the centers of two neighboring coupling regions 17 in the first lateral direction z is denoted by $d_{pD}$ (this will also be referred to as coupling region pitch in the following), and $d_{nD}$ denotes the distance between the centers of two neighboring field electrode structures in the second lateral direction (this will also be referred to as field electrode structure pitch in the following). According to one embodiment, the coupling region pitch $d_{pD}$ is larger than the field electrode structure pitch $d_{nD}$. According to embodiment, the coupling region pitch $d_{pD}$ is between 3 times and 100 times the field electrode structure pitch $d_{nD}$ ($3d_{nD} \leq d_{pD} \leq 100d_{nD}$), and in particular between 10 times and 100 times the field electrode structure pitch $d_{nD}$ ($10d_{nD} \leq d_{pD} \leq 100d_{nD}$). The coupling region pitch $d_{pD}$ is given by the width $d_{nS}$ of the drift region 11 in the first lateral direction z plus the width $d_{pS}$ of the coupling region 17, that is, $d_{pD} = d_{nS} + d_{pS}$.

Figure 29:
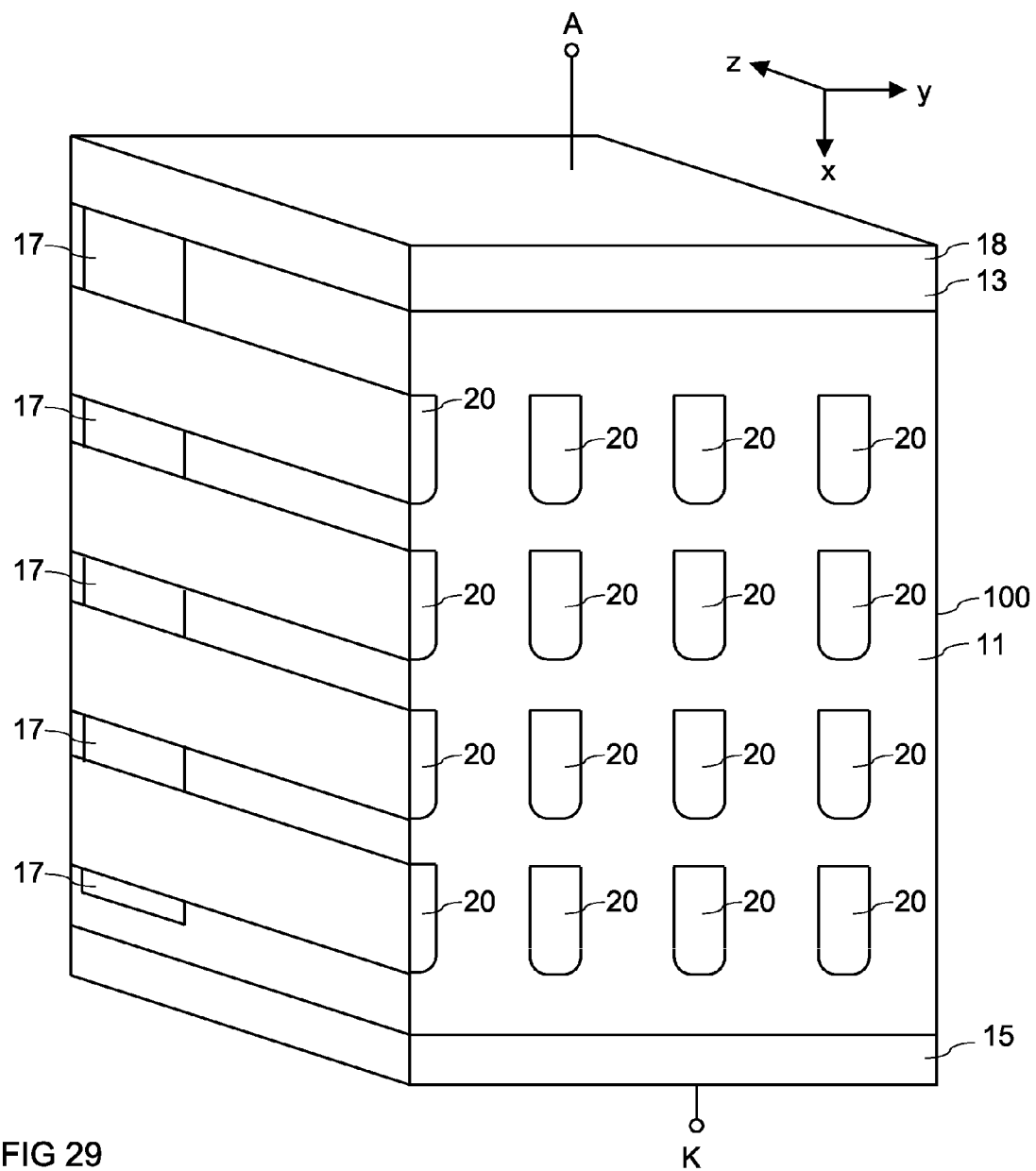
FIG. 29 illustrates a vertical cross sectional view of another embodiment of a semiconductor device that includes a coupling region that is coupled to a device region, and adjoins the at least one field electrode structure.

FIG. 29 illustrates one embodiment of a semiconductor device implemented as a diode. The device structure of this diode corresponds to the device structure of the semiconductor device shown in FIGS. 22 to 24, with the difference that the device region 13 is either an emitter region with a doping type complementary to the doing type of the drift region 11, or a Schottky region. Instead of a drain region, the diode includes a further emitter region 15.

Figure 30:
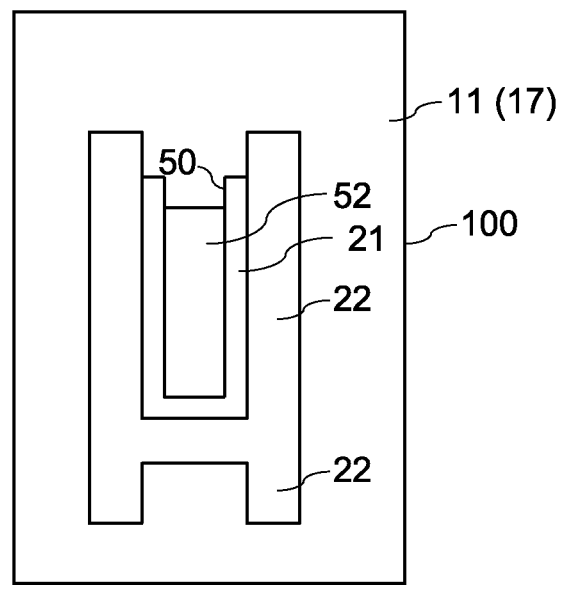
FIG. 30 illustrates a field electrode structure according to a further embodiment.

FIG. 30 illustrates a further embodiment of field electrode structure 20 that can be used in the semiconductor devices explained before. This field electrode structure 20 includes an electrode layer 21 along the bottom and the sidewalls of the field electrode dielectric 22, and a void 52 defined by the electrode layer and the drift region 11. A generation region 50 is formed between the electrode layer 21 and the drift region 11. The field electrode 21 may include one of the materials explained before that is suitable to form a generation region at a junction between the field electrode 21 and the drift region 11, such as a metal, a polycrystalline semiconductor material, carbon, or the like. Like the field electrode dielectrics 22 explained before, the field electrode dielectric 22 may include a charge carrier trap 27 for charge carriers of a charge carrier type complementary to the charge carriers trapped in the field electrode 21.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
   a drift region of a first doping type;
   a junction between the drift region and a device region;
   a plurality of field electrode structures spaced apart from each other in a current flow direction of the semiconductor device in the drift region, each of the plurality of field electrode structures comprising:
   a field electrode; and
   a coupling region of a second doping type complementary to the first doping type, the coupling region being electrically coupled to the device region and coupled to the field electrode of each of the plurality of field electrode structures,
   wherein each of the plurality of field electrode structures further comprises:
   a field electrode dielectric adjoining the field electrode, arranged between the field electrode and the drift region, and having an opening; and
   at least one of a field stop region and a generation region.

2. The semiconductor device of claim 1, wherein the coupling region adjoins at least one of the field electrode, the field stop region, the generation region, and the field electrode dielectric.

3. The semiconductor device of claim 1, wherein the coupling region adjoins the field electrode structure only in a region of the field electrode dielectric.

4. The semiconductor device of claim 1, wherein the field stop region has the first doping type, and is more highly doped than the drift region.

5. The semiconductor device of claim 1, wherein the field stop region connects the field electrode to at least one of the drift region and the coupling region through the opening of the field electrode dielectric.

6. The semiconductor device of claim 1, wherein the field stop region is at least partially arranged within the field electrode dielectric.

7. The semiconductor device of claim 6, wherein the field stop region is completely arranged within the field electrode dielectric.

8. The semiconductor device of claim 1, wherein a contact region is arranged between the field electrode and the field stop region.

9. The semiconductor device of claim 1, wherein the field stop region completely separates the field electrode from the drift region.

10. The semiconductor device of claim 1, wherein a section of the field electrode adjoins the drift region.

11. The semiconductor device of claim 1, wherein the at least one of the field stop region and the generation region does not extend more than 200 nm beyond the field electrode dielectric into the drift region in a direction perpendicular to a current flow direction of the semiconductor device.

12. The semiconductor device of claim 1, wherein the at least one of the field stop region and the generation region does not extend beyond the field electrode dielectric in a direction perpendicular to a current flow direction of the semiconductor device.

13. The semiconductor device of claim 1, wherein the generation region connects the field electrode to the drift region through the opening of the field electrode dielectric.

14. The semiconductor device of claim 1, wherein the generation region is arranged in the field electrode.

15. The semiconductor device of claim 1, wherein the generation region is at least partially arranged within the field electrode dielectric.

16. The semiconductor device of claim 1, wherein the generation region is completely arranged within the field electrode dielectric.

17. The semiconductor device of claim 1, wherein the generation region includes an interface region between the field electrode and the drift region.

18. The semiconductor device of claim 1, wherein the generation region comprises a void.

19. The semiconductor device of claim 1, wherein the field electrode includes at least one material selected from the group consisting of:
 a metal;
 a metal semiconductor compound;
 monocrystalline semiconductor material comprising dopant atoms;
 a polycrystalline semiconductor material comprising dopant atoms; and
 a monocrystalline semiconductor material comprising foreign material atoms or crystal defects.

20. The semiconductor device of claim 19, wherein the dopant atoms are dopant atoms of one of the first and second doping type.

21. The semiconductor device of claim 1,
 wherein the field electrode dielectric has a length extending in a current flow direction of the semiconductor device, and has a width extending in a direction perpendicular to the current flow direction, and
 wherein a ratio between the length and the width is higher than 1.

22. The semiconductor device of claim 1, wherein the opening of the field electrode dielectric is located in the direction of the junction.

23. The semiconductor device of claim 1, wherein the at least one field electrode structure comprises a shielding region arranged distant to the opening of the field electrode dielectric in a current flow direction of the semiconductor device.

24. The semiconductor device of claim 1, wherein the at least one of the field stop region, the generation region and the field electrode is implemented such that it adjoins a field electrode dielectric of a neighboring field electrode structure.

25. The semiconductor device of claim 1, wherein the semiconductor device is implemented as an MOS transistor, wherein the device region is a semiconductor region of a second doping type and forms a body region, and wherein the MOS transistor further comprises:
 a source region, wherein the body region is arranged between the drift region and the source region;
 a drain region, wherein the drift region is arranged between the drain region and the body region; and
 a gate electrode arranged adjacent to the body region and dielectrically insulated from the body region by a gate dielectric.

26. The semiconductor device of claim 1, wherein the semiconductor device is implemented as a bipolar diode, and wherein the device region is a semiconductor region of a second doping type and forms an emitter region.

27. The semiconductor device of claim 1, wherein the semiconductor device is implemented as a Schottky diode, and wherein the device region is a Schottky region.

28. The semiconductor device of claim 1, wherein the field electrode dielectric is substantially U-shaped.

29. The semiconductor device of claim 1, wherein the opening of the field electrode dielectric is arranged in a region of the field electrode dielectric that faces in a direction of the junction.

* * * * *